(12) United States Patent
Kim et al.

(10) Patent No.: US 12,733,167 B2
(45) Date of Patent: Sep. 8, 2026

(54) BONDING TYPE VERTICAL SEMICONDUCTOR DEVICES

(71) Applicant: SAMSUNG ELECTRONICS CO., LTD., Suwon-si (KR)

(72) Inventors: Samki Kim, Suwon-si (KR); Nambin Kim, Suwon-si (KR); Taehun Kim, Suwon-si (KR); Suhwan Lim, Suwon-si (KR); Hyeongwon Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 261 days.

(21) Appl. No.: 18/243,200

(22) Filed: Sep. 7, 2023

(65) Prior Publication Data

US 2024/0121958 A1 Apr. 11, 2024

(30) Foreign Application Priority Data

Oct. 6, 2022 (KR) ........................ 10-2022-0127553

(51) Int. Cl.
*H10B 43/27* (2023.01)

(52) U.S. Cl.
CPC .................................... *H10B 43/27* (2023.02)

(58) Field of Classification Search
CPC ...................................................... H10B 43/27
See application file for complete search history.

(56) References Cited

U.S. PATENT DOCUMENTS 5,158,898 A * 10/1992 Hayden .............. H10D 30/0316 257/E29.294
5,464,793 A * 11/1995 Roehl ............... H01L 23/53271 257/E21.507
11,201,107 B2 12/2021 Okina et al.
(Continued)

FOREIGN PATENT DOCUMENTS

CN 112567519 3/2021
CN 112885842 6/2021
(Continued)

OTHER PUBLICATIONS

Action dated Mar. 19, 2026 issued in corresponding to Korean Patent Application No. 10-2022-0127553.

*Primary Examiner* — Jeff W Natalini
*Assistant Examiner* — Jacob Raul Marin
(74) *Attorney, Agent, or Firm* — Morgan, Lewis & Bockius LLP

(57) ABSTRACT

A vertical semiconductor device includes; a pattern structure including a plurality of insulation patterns and a plurality of gate electrodes that are alternately and repeatedly stacked on a substrate, wherein the pattern structure includes a first gate electrode serving as a gate electrode of an erase transistor, wherein the first gate electrode is one of the plurality of gate electrodes; and a channel structure in a channel hole passing through the pattern structure, wherein the channel structure includes a data storage structure, a first channel, an undoped semiconductor liner, a doped semiconductor pattern, a filling insulation pattern and a capping pattern, wherein the data storage structure, the first channel, the undoped semiconductor liner, and the doped semiconductor pattern are sequentially disposed on a sidewall of the first gate electrode.

15 Claims, 24 Drawing Sheets

(56) References Cited

U.S. PATENT DOCUMENTS

| | | | | |
|---|---|---|---|---|
| 2005/0077510 | A1* | 4/2005 | Chu | H10D 30/015 257/190 |
| 2014/0030884 | A1* | 1/2014 | Rouh | H10D 64/664 438/653 |
| 2017/0179174 | A1* | 6/2017 | Yang | H10D 30/63 |
| 2018/0166344 | A1* | 6/2018 | Heo | H10D 30/63 |
| 2021/0043639 | A1* | 2/2021 | Yun | H10B 41/50 |
| 2021/0202458 | A1 | 7/2021 | Jung et al. | |
| 2021/0296358 | A1 | 9/2021 | Kanamori et al. | |
| 2021/0384221 | A1* | 12/2021 | Song | G11C 11/5657 |
| 2021/0399112 | A1* | 12/2021 | Lee | H10D 62/292 |
| 2022/0157847 | A1 | 5/2022 | Zhang et al. | |
| 2022/0302149 | A1 | 9/2022 | Zhang et al. | |
| 2022/0302150 | A1 | 9/2022 | Zhang et al. | |
| 2023/0035421 | A1 | 2/2023 | Lim et al. | |

FOREIGN PATENT DOCUMENTS

| | | |
|---|---|---|
| CN | 113169184 | 7/2021 |
| CN | 113892179 | 1/2022 |
| KR | 10-2020-0053067 A | 5/2020 |
| KR | 10-2023-0017950 | 2/2023 |

* cited by examiner 260
220
250
210
240
234
230
244a
242a
202a
204a
201
200
190

BONDING TYPE VERTICAL SEMICONDUCTOR DEVICES

CROSS-REFERENCE TO RELATED APPLICATION

This application claims priority under 35 USC § 119 to Korean Patent Application No. 10-2022-0127553, filed on Oct. 6, 2022, in the Korean Intellectual Property Office (KIPO), the disclosure of which is incorporated by reference herein in its entirety.

TECHNICAL FIELD

Example embodiments of the present inventive concept relates to semiconductor devices. Particularly, example embodiments of the present inventive concept relate to a bonding type vertical semiconductor devices.

DISCUSSION OF THE RELATED ART

Generally, a bonding-type vertical semiconductor device may be formed by bonding a first substrate, on which peripheral circuits are formed, and a second substrate, on which memory cells stacked in a vertical direction are formed, together. As the number of the stacked memory cells in the bonding type vertical semiconductor device increases, a data erase operation in each of the memory cells might not be easily performed.

SUMMARY

According to example embodiments of the present inventive concept, a vertical semiconductor device includes: a pattern structure including a plurality of insulation patterns and a plurality of gate electrodes that are alternately and repeatedly stacked on a substrate, wherein the pattern structure includes a first gate electrode serving as a gate electrode of an erase transistor, wherein the first gate electrode is one of the plurality of gate electrodes; and a channel structure in a channel hole passing through the pattern structure, wherein the channel structure includes a data storage structure, a first channel, an undoped semiconductor liner, a doped semiconductor pattern, a filling insulation pattern and a capping pattern, wherein the data storage structure, the first channel, the undoped semiconductor liner, and the doped semiconductor pattern are sequentially disposed on a sidewall of the first gate electrode.

According to example embodiments of the present inventive concept, a vertical semiconductor device includes: lower circuit patterns disposed on a first substrate; a lower insulating interlayer covering the lower circuit patterns; a pattern structure disposed on the lower insulating interlayer, wherein the pattern structure includes a plurality of insulation patterns and a plurality of gate electrodes alternately and repeatedly stacked in a vertical direction that is substantially perpendicular to an upper surface of the first substrate, and wherein the pattern structure includes a first gate electrode serving as a gate electrode of an erase transistor, wherein the first gate electrode is one of the plurality of gate electrodes; an insulating interlayer disposed on the lower insulating interlayer, and covering a lower portion of the pattern structure; a channel structure in each of channel holes that are passing through the pattern structure; and an upper base pattern disposed on the pattern structure, and contacting an upper surface of the channel structure, wherein the channel structure includes: a data storage structure and a first channel sequentially stacked on a sidewall of each of the channel holes; an undoped semiconductor liner and a doped semiconductor pattern disposed on the first channel and facing a sidewall of the first gate electrode; and a filling insulation pattern contacting the first channel, the semiconductor liner and the doped semiconductor pattern, and wherein the filling insulation pattern is disposed in each of the channel holes.

According to example embodiments of the present inventive concept, a vertical semiconductor device includes: lower circuit patterns formed on a first substrate; a bonding layer disposed on the lower circuit patterns; wiring disposed on the bonding layer; a pattern structure disposed on the wiring, wherein the pattern structure includes a plurality of insulation patterns and a plurality of gate electrodes alternately and repeatedly stacked in a vertical direction that is substantially perpendicular to an upper surface of the first substrate, and the pattern structure extends in a first direction parallel to the upper surface of the first substrate, wherein a sidewall of the pattern structure has a stepped shape; an upper base pattern disposed on the pattern structure; and a channel structure disposed in a channel hole that is passing through the pattern structure, and the channel structure contacts the upper base pattern, wherein the plurality of gate electrodes, which are included in the pattern structure, includes a first gate electrode disposed at an uppermost position among the plurality of gate electrodes, and a plurality of second gate electrodes, of the plurality of gate electrodes, is disposed below the first gate electrode, wherein the channel structure includes a data storage structure, a first channel, an undoped semiconductor liner, and a doped semiconductor pattern sequentially disposed to face a sidewall of the first gate electrode.

BRIEF DESCRIPTION OF THE DRAWINGS

The above and other features of the present inventive concept will become more apparent by describing in detail example embodiments thereof, with reference to the accompanying drawings, in which:

FIGS. 1, 2, 3, 4, 5, 6, 7, 8, 9, 10, 11, 12, 13, 14, 15, 16, 17, 18, 19, 20, and 21 are cross-sectional views illustrating a method of manufacturing a vertical semiconductor device according to example embodiments of the present inventive concept;

FIG. 24 is an enlarged cross-sectional view of a portion of a vertical semiconductor device according to example embodiments of the present inventive concept.

DETAILED DESCRIPTION OF THE EMBODIMENTS

Hereinafter, example embodiments of the present inventive concept will be described in detail with reference to the accompanying drawings.

Hereinafter, one direction parallel to the substrate surface is referred to as a first direction, and a direction parallel to the substrate surface and crossing the first direction is described as a second direction. In addition, a direction substantially perpendicular to the substrate surface is described as a vertical direction.

FIGS. 1 to 21 are cross-sectional views illustrating a method of manufacturing a vertical semiconductor device according to example embodiments of the present inventive concept.

FIGS. 5, 13, 15, 17, and 19 are enlarged cross-sectional views of a portion of a channel structure in the vertical semiconductor device.

Figure 1:
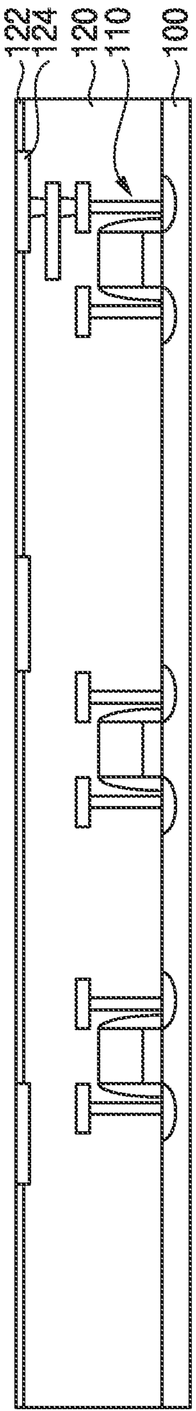

Referring to FIG. 1, lower circuit patterns 110 may be formed on a first substrate 100. The lower circuit patterns 110 may include peripheral circuits. The lower circuit patterns 110 may include, e.g., transistors and wirings. A lower insulating interlayer 120 may be formed to cover the lower circuit patterns.

The first substrate 100 may include a semiconductor material such as silicon, germanium, or silicon-germanium, or a group III-V compound such as GaP, GaAs, or GaSb. In some example embodiments of the present inventive concept, the first substrate 100 may be a silicon-on-insulator (SOI) substrate or a germanium-on-insulator (GOI) substrate.

A first bonding layer 122 may be formed on an uppermost surface of the lower insulating interlayer 120. In some example embodiments of the present inventive concept, the first bonding layer 122 may include SiCN. A first bonding pattern 124 may be formed on the lower insulating interlayer 120 to pass through the first bonding layer 122. For example, the first bonding pattern 124 may be exposed by the first bonding layer 122. A surface (e.g., an upper surface) of the first bonding pattern 124 may be substantially coplanar with a surface (e.g., an upper surface) of the first bonding layer 122. Thus, the first bonding pattern 124 may be exposed to an outside. The first bonding pattern 124 may include a metal. The first bonding pattern 124 may include, e.g., copper or aluminum. The first bonding pattern 124 may be electrically connected to wirings included in the lower circuit patterns 110.

Referring to FIGS. 2 to 9, vertical memory cells may be formed on a second substrate 190. Hereinafter, an example of a method for manufacturing vertical memory cells on the second substrate 190 may be described, but the method of manufacturing vertical memory cells is not necessarily limited thereto.

Figure 2:
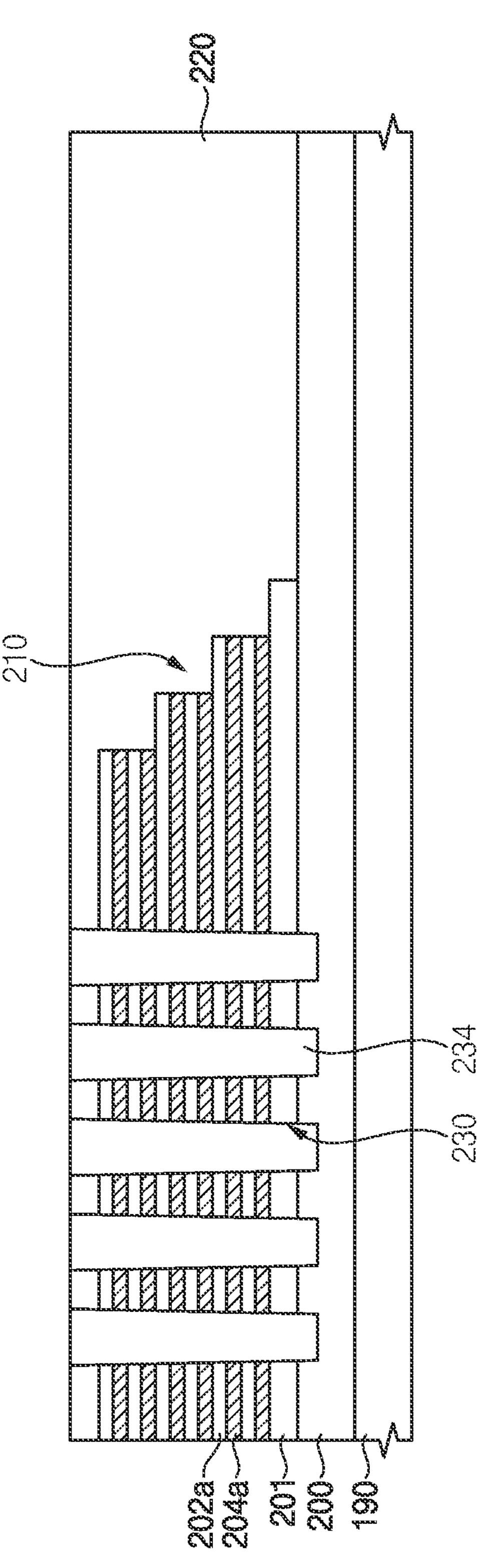

Referring to FIG. 2, a substrate base layer 200 may be formed on the second substrate 190. In some example embodiments of the present inventive concept, the substrate base layer 200 may be formed of a polysilicon layer.

The second substrate 190 may include, e.g., a semiconductor material such as silicon, germanium, or silicon-germanium, or a III-V compound such as GaP, GaAs, or GaSb. In some example embodiments of the present inventive concept, the second substrate 190 may be a silicon-on-insulator (SOI) substrate or a germanium-on-insulator (GOI) substrate. Hereinafter, it may be described that the second substrate 190 includes, for example, silicon.

A lowermost insulation layer may be formed on the substrate base layer 200. A first sacrificial layer and a first insulation layer may be alternately and repeatedly stacked on the lowermost insulation layer in the vertical direction to form a first mold layer including a lowermost insulation layer, first insulation layers, and first sacrificial layers. In some example embodiments of the present inventive concept, the lowermost insulation layer may directly contact the substrate base layer 200, and the lowermost insulation layer may have a thickness greater than a thickness of each of the first insulation layers.

The lowermost insulation layer and the first insulation layers may include an oxide, e.g., silicon oxide. The first sacrificial layer may include a material having an etch selectivity with respect to the lowermost insulation layer and the first insulation layer. The first sacrificial layer may include nitride, e.g., silicon nitride.

Thereafter, the first insulation layers and the first sacrificial layers may be sequentially etched, and then the lowermost insulation layer may be etched to form a first mold structure 210 having sidewalls with a stepped shape. The first mold structure 210 may have a structure in which the first sacrificial pattern **204*a* and the first insulation pattern 202*a* are alternately stacked on a lowermost insulation pattern 201**.

A first insulating interlayer 220 may be formed on the substrate base layer 200 and may cover the first mold structure 210. A planarization process of the upper surface of the first insulating interlayer 220 may be performed.

Thereafter, upper portions of the first insulating interlayer 220, the first mold structure 210 and the substrate base layer 200 may be etched to form first channel holes 230 passing through the first insulating interlayer 220 and extending to an inside of the substrate base layer 200. For example, the first channel holes 230 partially penetrate the substrate base layer 200. The first channel holes 230 may be arranged in unit of cell blocks. For example, the first channel holes 230 may be arranged in a predetermined direction with a predetermined interval. For example, the first channel holes 230 may be alternately arranged with a predetermined interval.

For example, a sidewall of the first channel hole 230 may have a vertical slope with respect to an upper surface of the substrate base layer 200. However, when the first channel hole 230 is formed by an actual etching process, the sidewall of the first channel hole 230 may have a slope such that an inner width of the first channel hole 230 gradually decreases downward. Accordingly, a lower width of the first channel hole 230 may be less than an upper width of the first channel hole 230.

A first filling sacrificial pattern 234 may be formed to fill the first channel hole 230.

Figure 3:
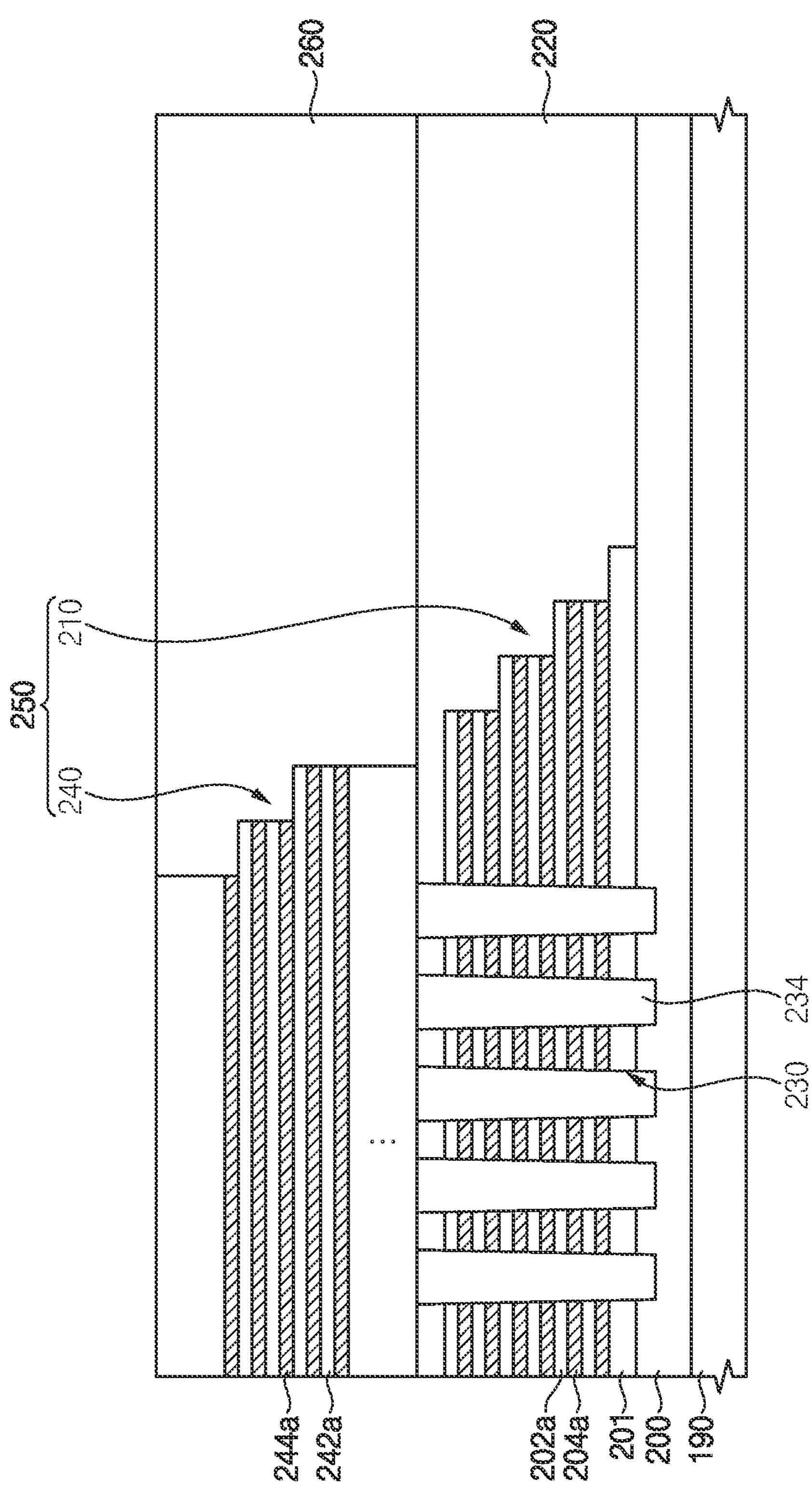

Referring to FIG. 3, a second insulation layer and a second sacrificial layer may be alternately and repeatedly stacked on the first insulating interlayer 220 and the first filling sacrificial pattern 234 in the vertical direction to form a second mold layer including second insulation layers and second sacrificial layers.

Thereafter, the second insulation layers and the second sacrificial layers may be sequentially etched to form a second mold structure 240 having sidewalls with a stepped shape. The second mold structure 240 may have a structure in which second insulation patterns **242*a* and second sacrificial patterns 244*a* are alternately and repeatedly stacked. A structure in which the first mold structure 210 and the second mold structure 240 are stacked may be referred to as a mold structure 250**.

A second insulating interlayer 260 may be formed on the first insulating interlayer 220 and may cover the second mold structure 240. A planarization of an upper surface of the second insulating interlayer 260 may be performed. The first and second insulating interlayers 220 and 260 may include the same material as each other, e.g., silicon oxide.

Figure 4:
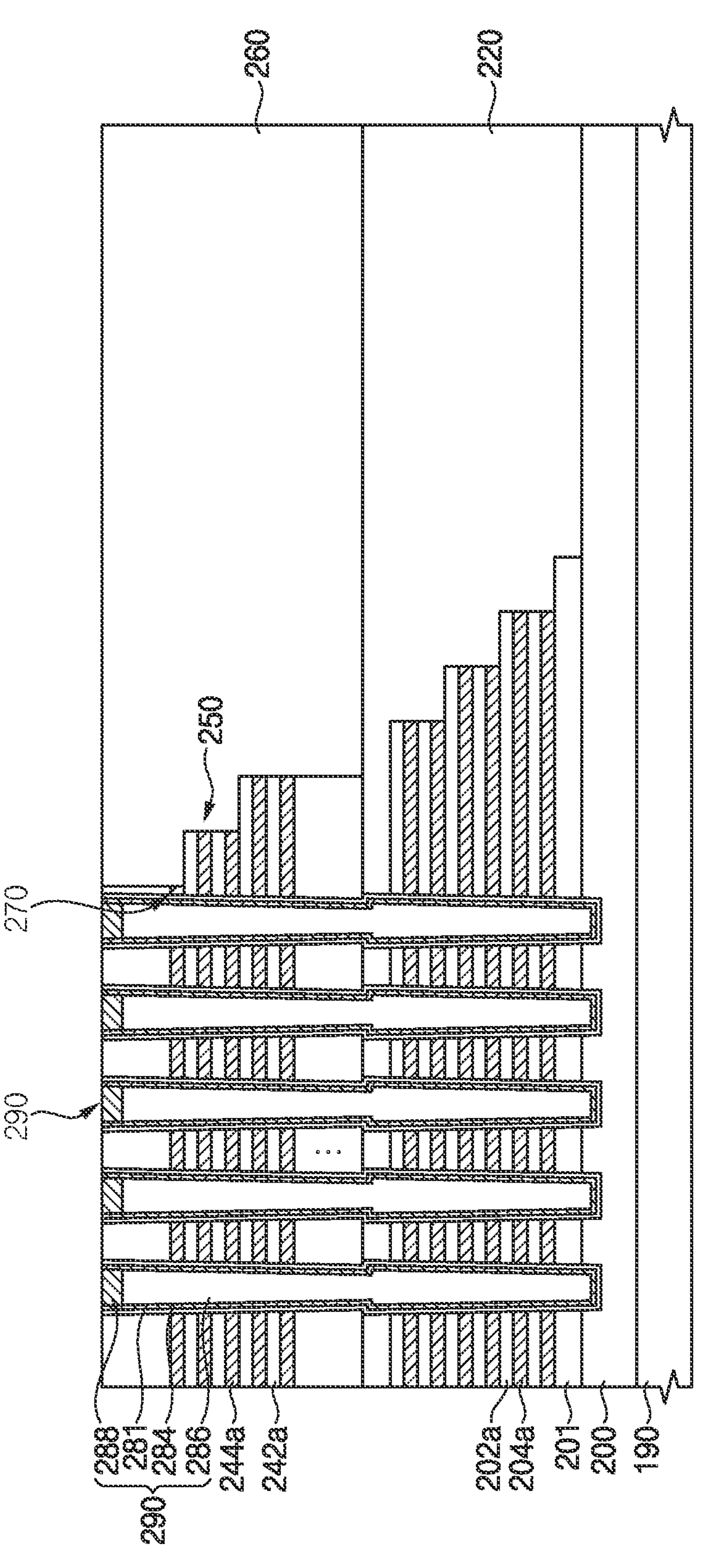
Figure 5:
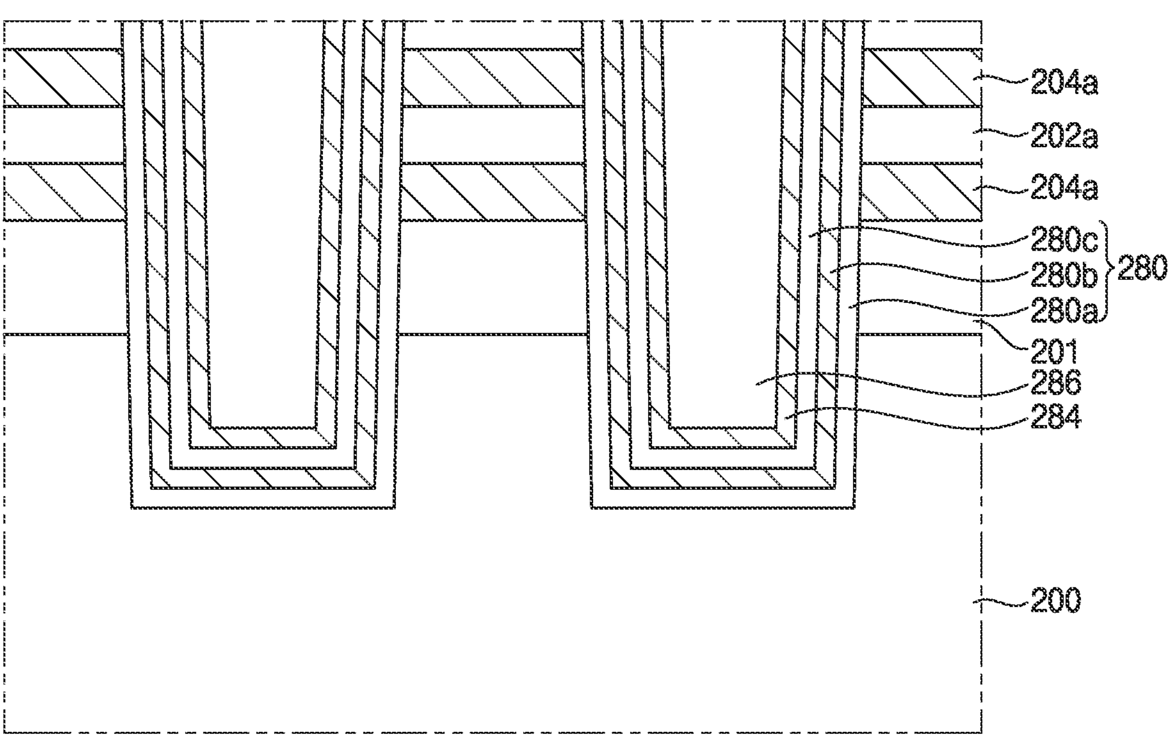

Referring to FIGS. 4 and 5, the second insulating interlayer 260 and the second mold structure 240 may be etched to form second channel holes passing through the second insulating interlayer 260 and the second mold structure 240. The second channel holes may expose an upper surface of the first filling sacrificial pattern 234.

After that, the first filling sacrificial pattern 234 may be removed. In some example embodiments of the present inventive concept, the removing process may include a wet etching process. Accordingly, the first and second channel holes may be connected to each other to form a channel hole 270 passing through the mold structure 250 and extending to the inside of the substrate base layer 200. A bottom surface of the channel hole 270 may be lower than the upper surface of the substrate base layer 200.

Thereafter, a first blocking dielectric layer, a charge storage layer, and a tunnel insulation layer may be sequentially formed conformally on a sidewall and bottom of the channel hole 270 and the second insulating interlayer 260.

For example, the first blocking dielectric layer may include silicon oxide, the charge storage layer may include silicon nitride, and the tunnel insulation layer may include silicon oxide. A channel layer may be conformally formed on the tunnel insulation layer. A filling insulation layer may be formed on the channel layer to fill a remaining space of the channel hole 270. For example, the channel layer may include polysilicon undoped with impurities. The filling insulation layer may include an oxide, e.g., silicon oxide.

The filling insulation layer, the channel layer, the first blocking dielectric layer, the charge storage layer and the tunnel insulation layer may be planarized until an upper surface of the second insulating interlayer 260 may be exposed. Thereafter, upper portions of the filling insulation layer and the channel layer may be removed to form a first recess, and a capping pattern 288 may be formed in the first recess. The capping pattern 288 may include, e.g., polysilicon doped with impurities or polysilicon undoped with impurities.

Accordingly, a preliminary channel structure 290 including a preliminary first blocking dielectric layer pattern 280*a*, a preliminary charge storage layer pattern 280*b*, a preliminary tunnel insulation pattern 280*c*, a preliminary channel 284, a first preliminary filling insulation pattern 286 and the capping pattern 288 may be formed in the channel hole 270.

To avoid the complexity of the drawings, in each of cross-sectional views, the preliminary first blocking dielectric layer pattern 280*a*, the preliminary charge storage layer pattern 280*b*, and the preliminary tunnel insulation pattern 280*c* may be merged into one layer, and the one layer may be referred to as a preliminary data storage structure 280.

Figure 6:
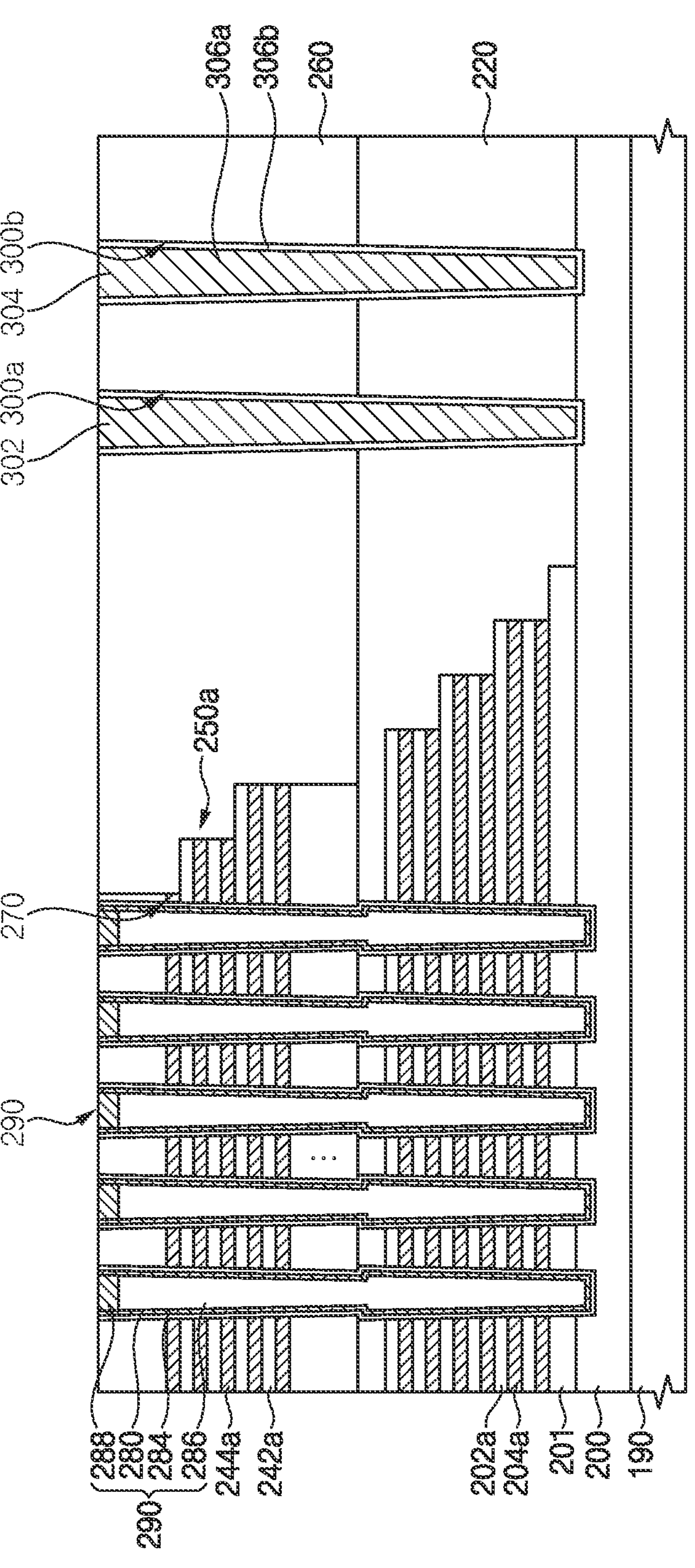

Referring to FIG. 6, the first and second insulating interlayers 220 and 260 of a portion where the mold structure 250 is not formed may be etched to form first and second contact holes 300*a* and 300*b* passing through the first and second insulating interlayers 220 and 260 and extending into an upper portion of the substrate base layer 200. The first contact hole 300*a* may be disposed adjacent to the mold structure 250. The second contact hole 300*b* may be disposed farther from the mold structure 250 than the first contact hole 300*a*. For example, the first contact hole 300*a* may be disposed between the mold structure 250 and the second contact hole 300*b*.

A barrier metal layer may be formed on surfaces of the first and second contact holes 300*a* and 300*b*, and a metal layer may be formed on the barrier metal layer to fill the first and second contact holes 300*a* and 300*b*. Thereafter, the metal layer and the barrier metal layer may be planarized so that the upper surface of the second insulating interlayer 260 may be exposed to form a first contact plug 302 and a second contact plug 304. The first contact plug 302 may be formed in the first contact hole 300*a* and the second contact plug 304 may be formed in the second contact hole 300*b*. The first and second contact plugs 302 and 304 may include a barrier metal pattern 306*b* and a metal pattern 306*a*.

Figure 7:
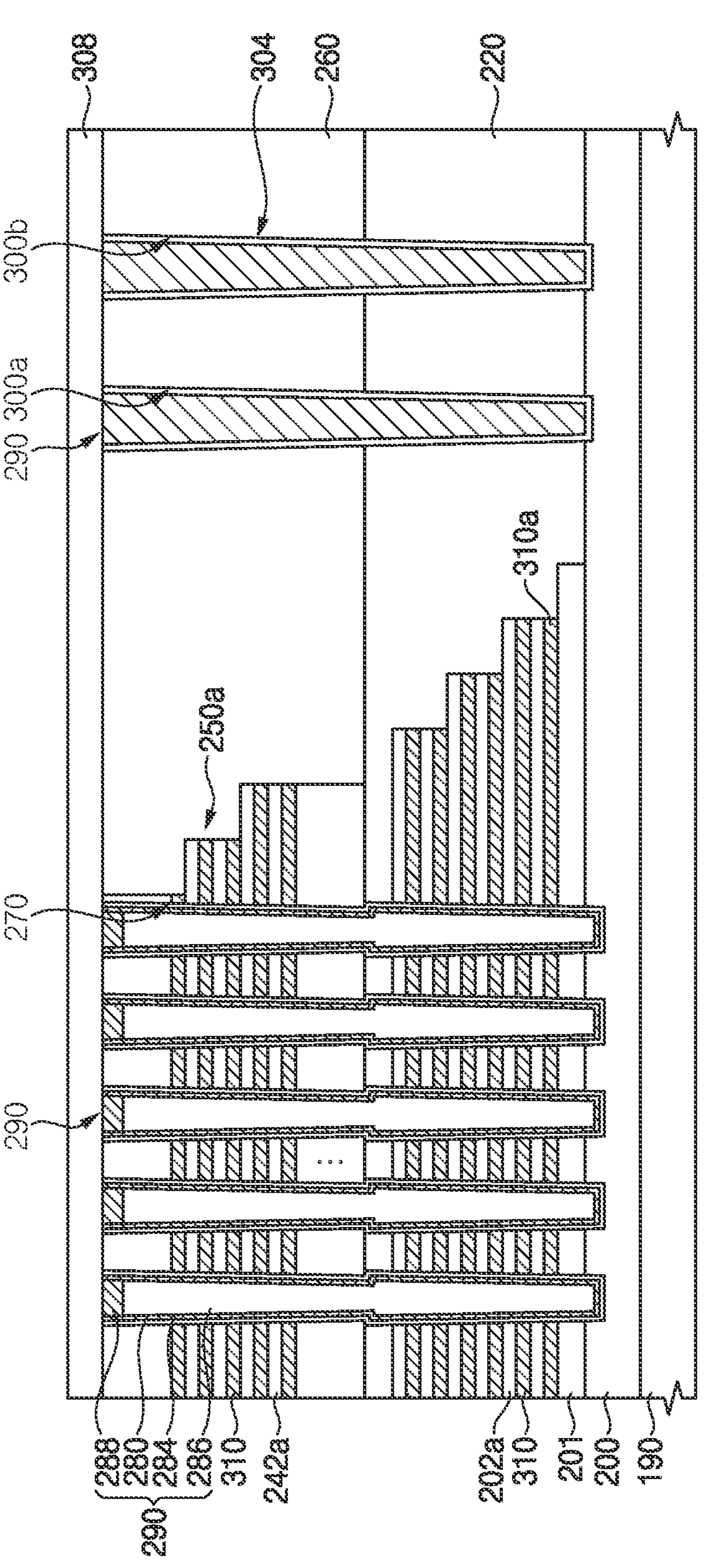

Referring to FIG. 7, a third insulating interlayer 308 may be formed on the second insulating interlayer 260, the preliminary channel structure 290, and the first and second contact plugs 302 and 304. A trench may be formed through the third insulating interlayer 308, the second insulating interlayer 260, the first insulating interlayer 220, and the mold structure 250 by, e.g., a dry etching process. A surface of the substrate base layer 200 may be exposed by a bottom of the trench.

The trench may extend in the first direction, and a plurality of trenches may be arranged in the second direction. As the trenches are formed, the mold structures 250 may be separated from each other. Accordingly, each of the mold structures 250 may extend in the first direction.

Thereafter, the first and second sacrificial patterns 204*a* and 244*a* exposed by the trench may be removed to form a first gap between the first insulation patterns 202*a* and between the second insulation patterns 242*a*. For example, a portion of an outer sidewall of the preliminary first blocking dielectric layer pattern 280*a* may be exposed by the first gap.

In some example embodiments of the present inventive concept, the first and second sacrificial patterns 204*a* and 244*a* may be removed by a wet etching process using phosphoric acid (H3PO4) or sulfuric acid (H2SO4).

Thereafter, a second blocking dielectric layer may be formed on surfaces of the trench and the first gap and on the upper surface of the third insulating interlayer 308, and a gate electrode layer may be formed on the second blocking dielectric layer.

In some example embodiments of the present inventive concept, the second blocking dielectric layer may include a metal oxide, e.g., aluminum oxide, hafnium oxide, or zirconium oxide. The gate electrode layer may include a metal. The gate electrode layer may include a barrier metal layer and a metal layer. The barrier metal layer may include, e.g., titanium, titanium nitride, tantalum, tantalum nitride, or the like, and the metal layer may include tungsten.

Thereafter, the gate electrode layer may be partially removed to form a gate electrode 310 in each of the first gaps. For example, each of the first and second sacrificial patterns 204*a* and 244*a* may be replaced with the gate electrode 310.

In some example embodiments of the present inventive concept, the gate electrode 310 may extend in the first direction, and the plurality of gate electrodes 310 may be stacked on each other in the vertical direction to be spaced apart from each other. Accordingly, a pattern structure 250*a* in which the gate electrode 310 and the insulation pattern 202*a* and 242*a* are repeatedly stacked may be formed. In this case, a plurality of pattern structures 250*a* may be arranged in the second direction to be spaced apart from each other by the trenches.

In some example embodiments of the present inventive concept, at least one gate electrode 310*a* formed on a bottom of the pattern structure 250*a* may serve as a gate electrode of an erase transistor for erasing data. The data may erase using a Gate Induced Drain Leakage (GIDL) phenomenon, and thus, the erase transistor may also be referred to as a GIDL transistor. Hereinafter, the gate electrode of the erase transistor is referred to as a first gate electrode 310*a*.

A gate electrode formed on the first gate electrode 310*a* may serve as a gate electrode of a ground select transistor.

For example, the gate electrode of the ground select transistor may be formed directly on the first gate electrode 310*a*. Memory cell transistors and a string select transistor may be disposed on the ground select transistor.

Thereafter, a second filling insulation pattern may be formed to fill the trench.

Figure 8:
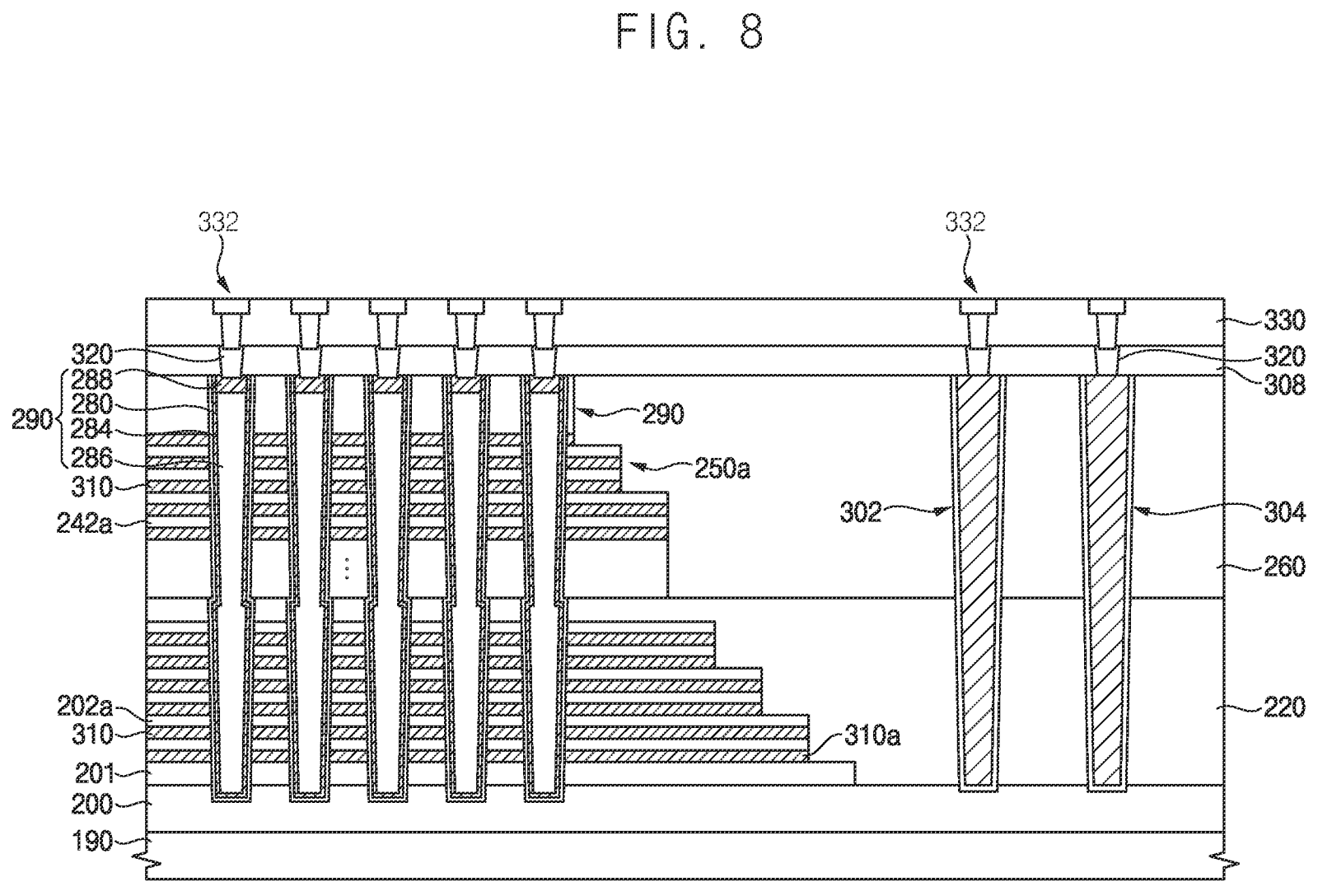

Referring to FIG. 8, third contact plugs 320 may be formed through a third insulating interlayer 308. Each of the third contact plugs 320 may contact one of the capping pattern 288 or the first and second contact plugs 302 and 304.

Cell contact plugs may be formed through the first to third insulating interlayers 220, 260 and 308 and the insulation patterns 202*a* and 242*a*. The cell contact plugs may contact the gate electrodes 310, respectively. The cell contact plugs may be formed on an edge of the pattern structure 250*a* having stepped shape.

A fourth insulating interlayer 330 may be formed on the third insulating interlayer 308, the third contact plugs 320 and the cell contact plugs. A first wiring 332 may be formed through the fourth insulating interlayer 330, and the first wiring 332 may be electrically connected to the third contact plugs 320. In some example embodiments of the present inventive concept, the first wiring 332 may include a contact plug and a conductive line.

Figure 9:
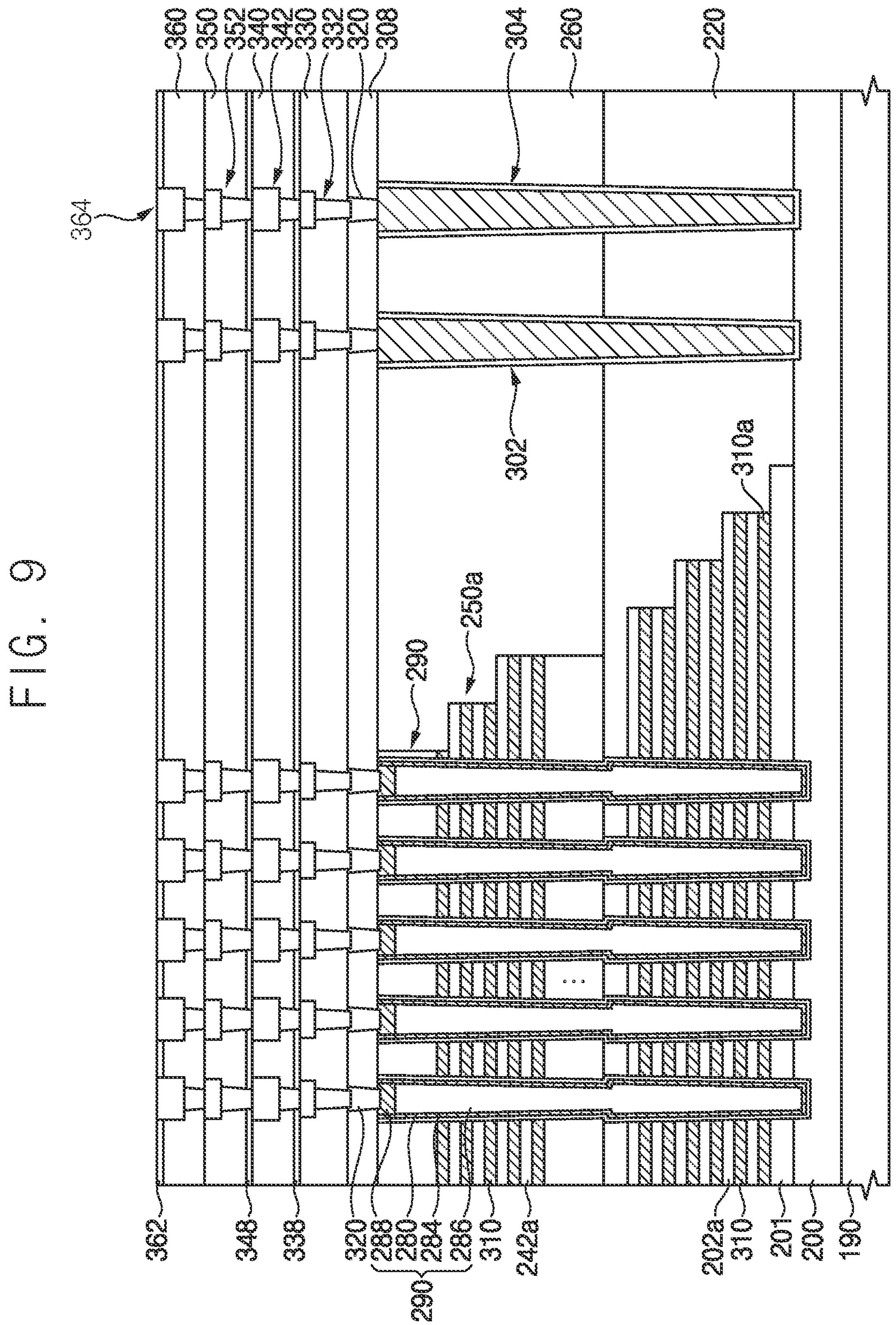

Referring to FIG. 9, a first diffusion barrier layer 338 may be formed on the fourth insulating interlayer 330 and the first wiring 332. The first diffusion barrier layer 338 may include, e.g., a silicon nitride layer, a silicon oxynitride layer, or a SiOCN layer.

A fifth insulating interlayer 340 may be formed on the first diffusion barrier layer 338. A second wiring 342 may be formed through the fifth insulating interlayer 340 and the first diffusion barrier layer 338, and the second wiring 342 may be electrically connected to the first wiring 332. In some example embodiments of the present inventive concept, the second wiring 342 may include a contact plug and a conductive line. The second wiring 342 may include a metal.

In some example embodiments of the present inventive concept, the second wiring 342 may be formed by a dual damascene process or a single damascene process.

A second diffusion barrier layer 348 and a sixth insulating interlayer 350 may be formed on the fifth insulating interlayer 340 and the second wiring 342. A third wiring 352 may be formed through the sixth insulating interlayer 350 and the second diffusion barrier layer 348, and the third wiring 352 may be electrically connected to the second wiring 342. In this way, multi-layer wirings may be formed in the insulating interlayers.

Subsequently, a seventh insulating interlayer 360 may be formed on the sixth insulating interlayer 350 and the third wiring 352. In some example embodiments of the present inventive concept, the seventh insulating interlayer 360 may be an uppermost insulating interlayer.

A second bonding layer 362 may be formed on the seventh insulating interlayer 360. In some example embodiments of the present inventive concept, the second bonding layer 362 may include a material the same as a material of the first bonding layer 122 that is formed on the first substrate 100. For example, the second bonding layer 362 may include SiCN.

A second bonding pattern 364 may be formed through the seventh insulating interlayer 360 and the second bonding layer 362, and may be electrically connected to the third wiring 352.

For example, the second bonding pattern 364 may be exposed by the seventh insulating interlayer 360 and the second bonding layer 362. An upper surface of the second bonding pattern 364 may be substantially coplanar with an upper surface of the second bonding layer 362, and may be exposed to an outside.

In some example embodiments of the present inventive concept, the second bonding pattern 364 may be formed by a dual damascene process or a single damascene process.

The second bonding pattern 364 may include a metal. In some example embodiments of the present inventive concept, the second bonding pattern 364 may include a material the same as that of the first bonding pattern 124. For example, the second bonding pattern 364 may include copper or aluminum.

Memory structures may be formed on the second substrate 190 by the processes described with reference to FIGS. 2 to 9.

Figure 10:
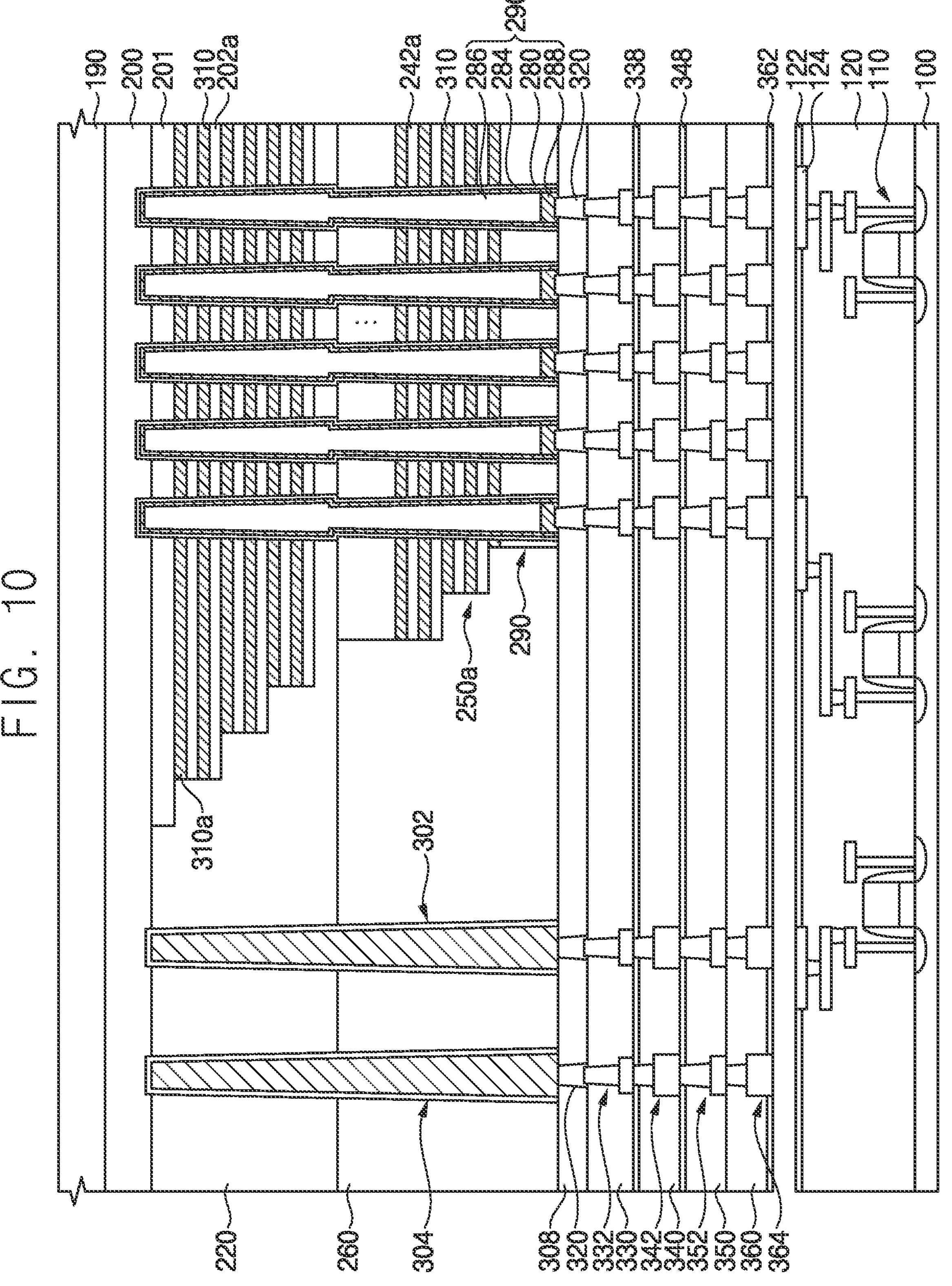
Figure 11:
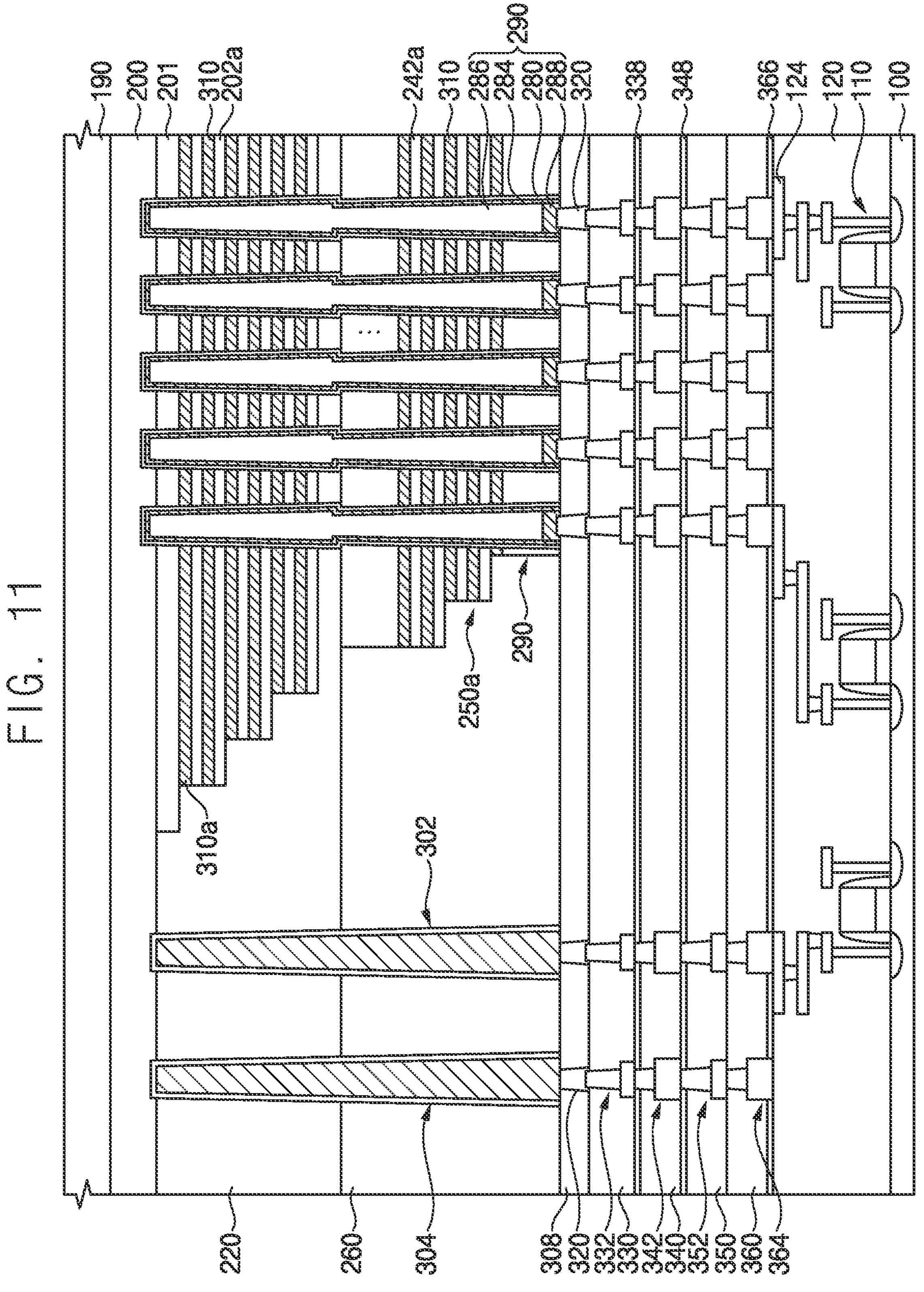

Referring to FIGS. 10 and 11, the second substrate 190 may be rotated 180 degrees. Thereafter, the second bonding layer 362 that is formed on the second substrate 190 may be bonded to the first bonding layer 122 formed on the first substrate 100. The first bonding layer 122 and the second bonding layer 362 may serve as a single bonding layer 366, and the bonding layer 366 may be positioned between the lower insulating interlayer 120 and the seventh insulating interlayer 360.

In this case, the first bonding pattern 124 and a second bonding pattern 364 aligned with the first bonding pattern 124 may be bonded to each other.

Therefore, the first substrate 100 and the second substrate 190 may be bonded to each other to form a single body. At this time, structures formed on the second substrate 190 may be reversed, and upper and lower relationships may be described based on a changed state. For example, a portion away from an upper surface of the first substrate 100 in the vertical direction may be described as an upper portion.

Figure 12:
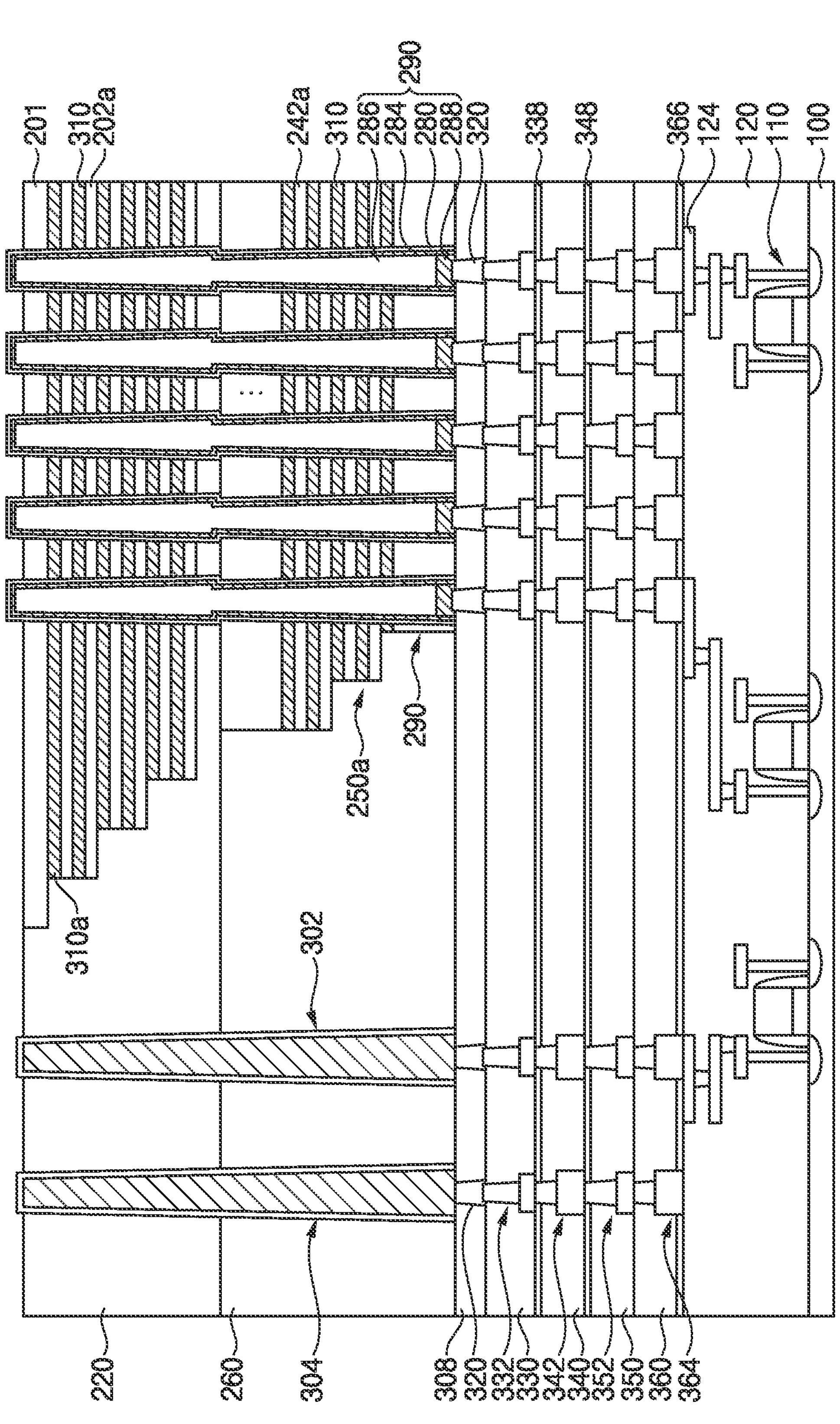
Figure 13:
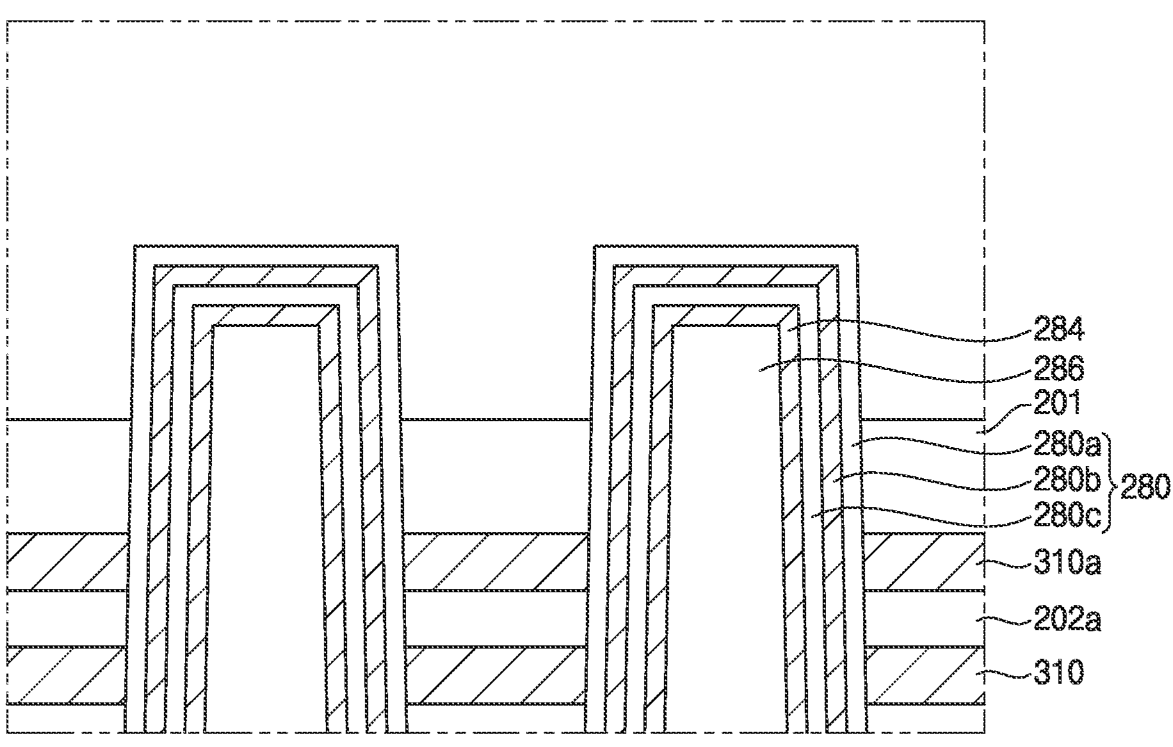

Referring to FIGS. 12 and 13, the second substrate 190 may be removed so that the upper surface of the substrate base layer 200 may be exposed.

The removing of the second substrate 190 may include, for example, a grinding process and a chemical mechanical polishing (CMP) process. In some example embodiments of the present inventive concept, most of the second substrate 190 may be removed by the grinding process, and then the chemical mechanical polishing process may be performed.

Subsequently, the substrate base layer 200 may be removed. The removing of the substrate base layer 200 may include a wet etching process.

Accordingly, the lowermost insulation pattern 201, the preliminary channel structure 290, the first insulating interlayer 220, and the first and second contact plugs 302 and 304 may be exposed on an uppermost portion above the first substrate 100.

An upper surface of the preliminary channel structure 290 may protrude from an upper surface of the lowermost insulation pattern 201. For example, the preliminary first blocking dielectric layer pattern 280*a* included in the preliminary channel structure 290 may be exposed to the outside. In addition, portions of the first and second contact plugs 302 and 304 may protrude from an exposed upper surface of the first insulating interlayer 220. The barrier metal pattern of each of the first and second contact plugs 302 and 304 may be exposed to the outside from the first insulating interlayer 220.

Figure 14:
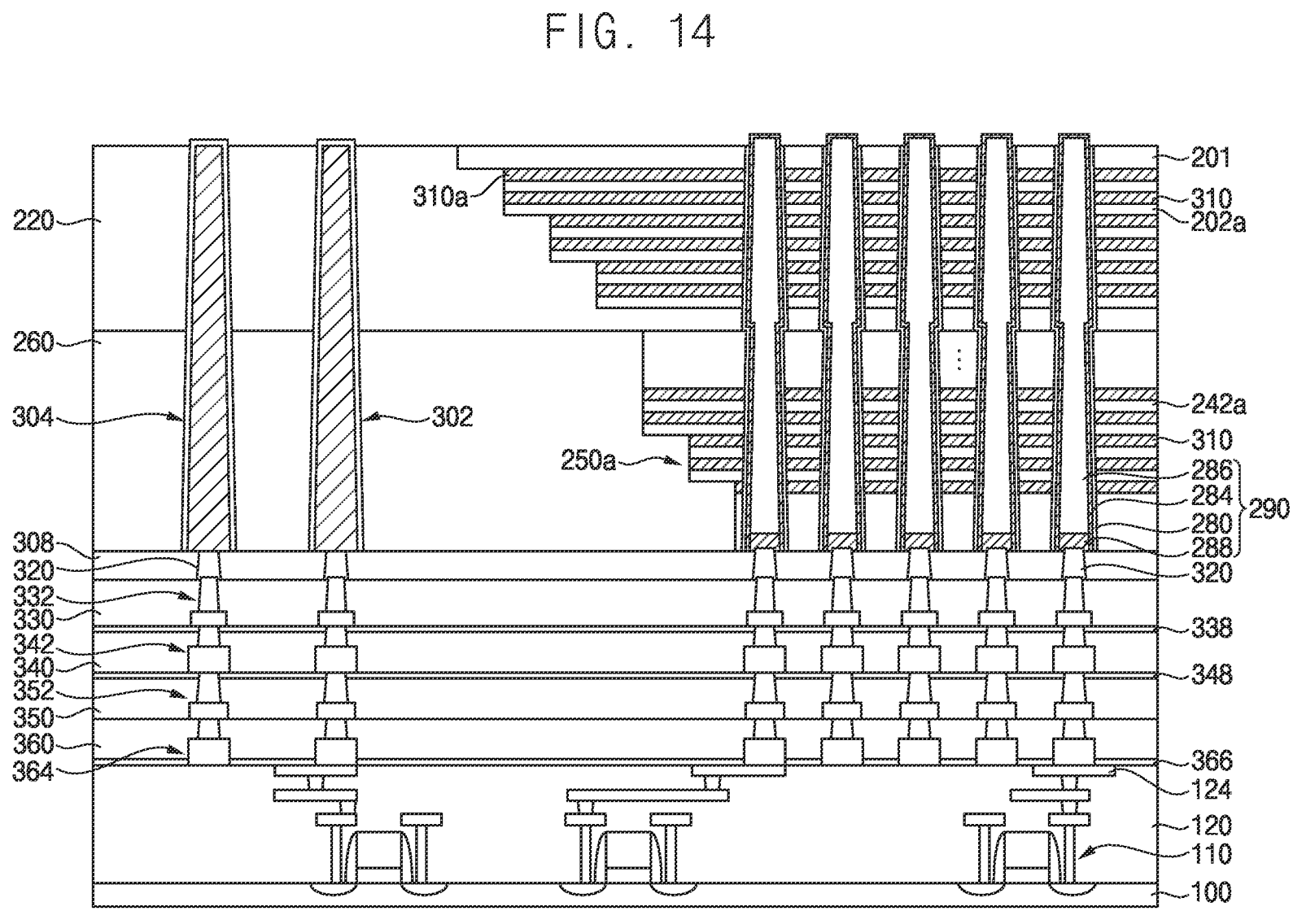
Figure 15:
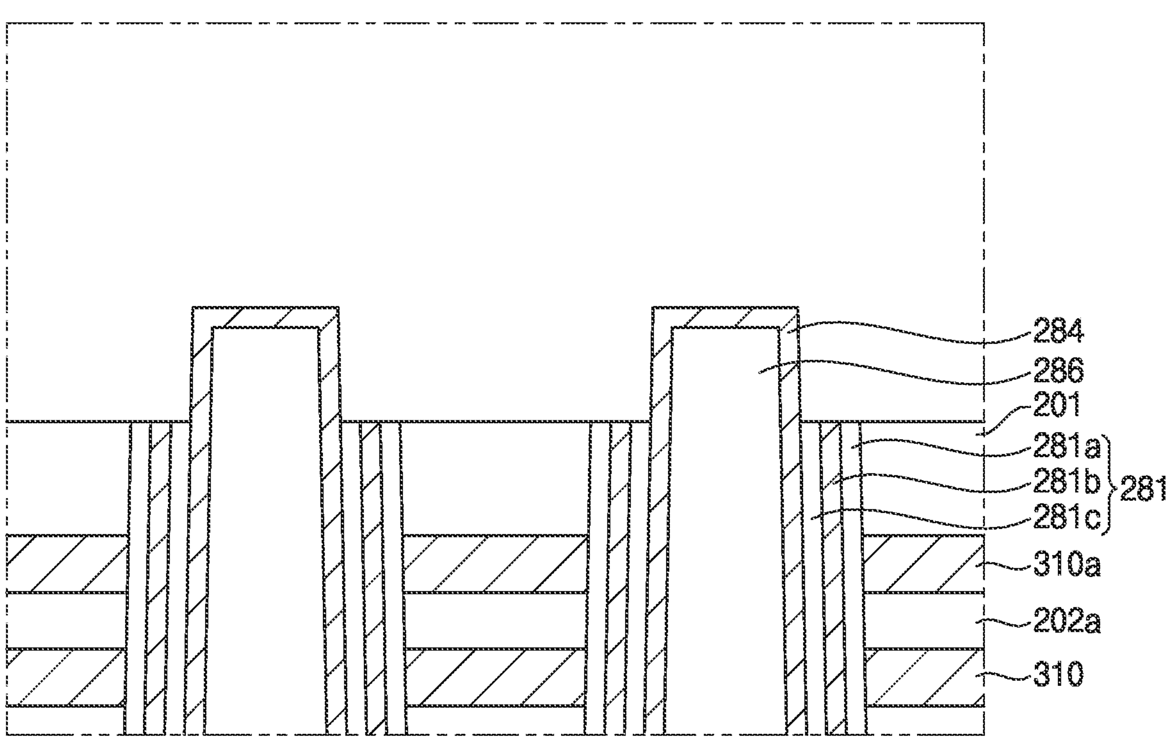

Referring to FIGS. 14 and 15, the preliminary first blocking dielectric layer pattern 280*a*, the preliminary charge storage layer pattern 280$b$, and the preliminary tunnel insulation pattern 280$c$ corresponding to the protruding portion of the preliminary channel structure 290 may be sequentially etched to form a first blocking dielectric layer pattern 281$a$, a charge storage layer pattern 281$b$, and a tunnel insulation pattern 281$c$. The etching process may include a wet etching process.

The first blocking dielectric layer pattern 281$a$, the charge storage layer pattern 281$b$, and the tunnel insulation pattern 281$c$ may serve as a data storage structure 281.

The data storage structure 281 may at least partially surround a sidewall of the preliminary channel 284. The data storage structure 281 may have a cylindrical shape having openings at a top and a bottom thereof. The data storage structure 281 might not cover a portion of the preliminary channel 284 that is protruding from the upper surface of the lowermost insulation pattern 201.

In the etching process, the first and second contact plugs 302 and 304 might not be removed.

Figure 16:
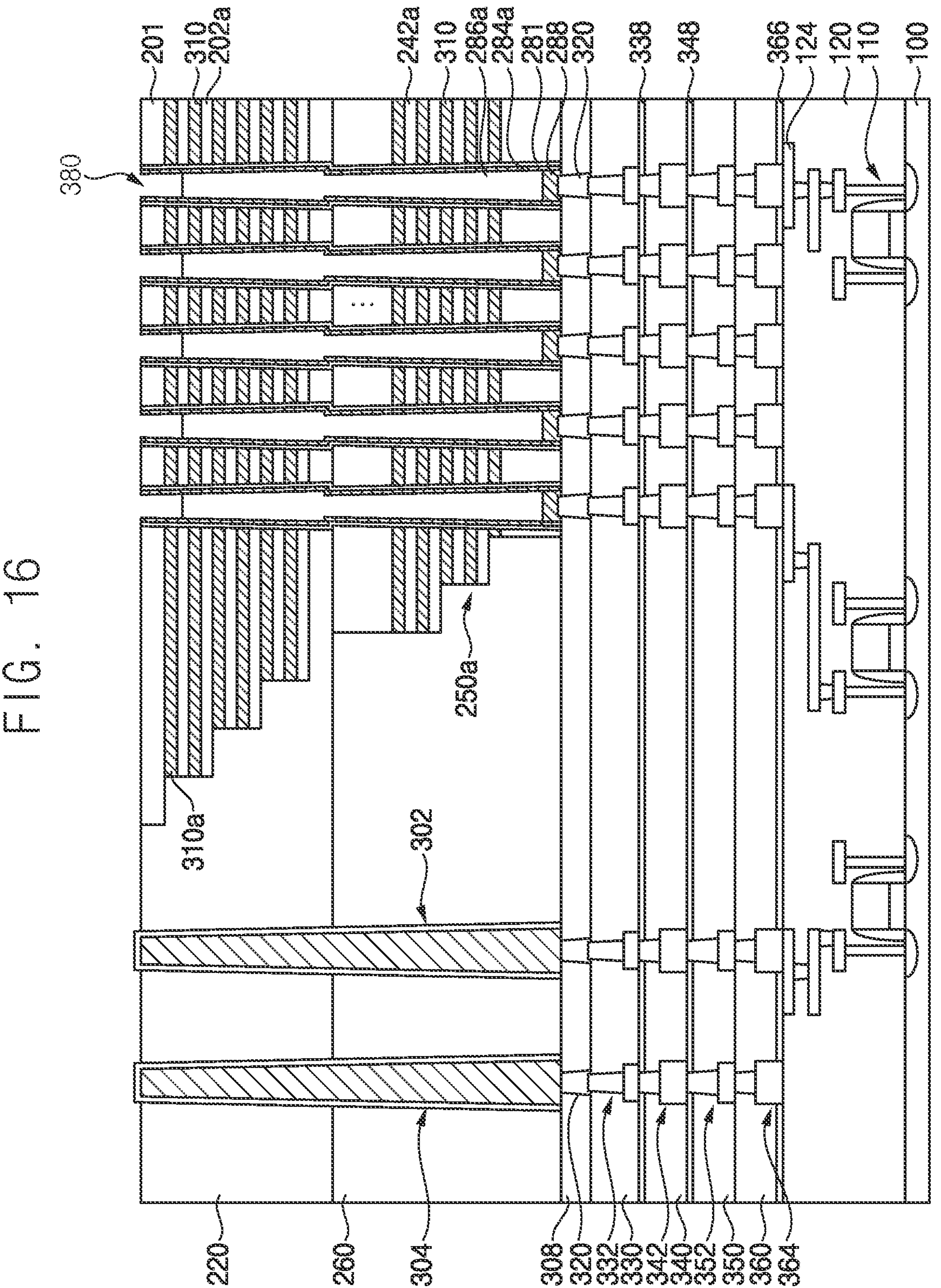
Figure 17:
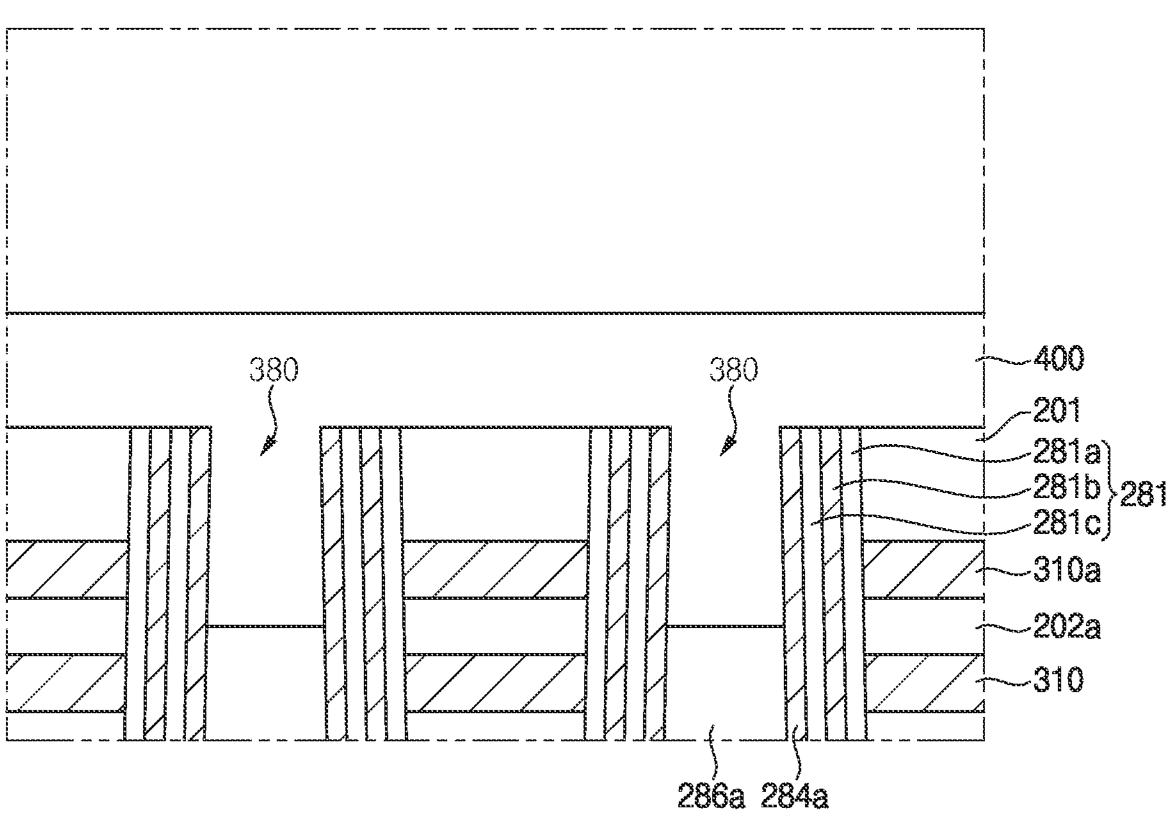

Referring to FIGS. 16 and 17, the preliminary channel 284 protruding from the upper surface of the lowermost insulation pattern 201 may be etched to form a first channel 284$a$. The first channel 284$a$ may have a cylindrical shape with openings at a top and a bottom thereof.

Thereafter, an upper portion of the first preliminary filling insulation pattern 286 may be partially etched to form a first filling insulation pattern 286$a$ that partially fills the channel hole 270. An upper surface of the first filling insulation pattern 286$a$ may be disposed in the horizontal direction with a sidewall of the first insulation pattern 202$a$ interposed between the first gate electrode 310$a$ of the erase transistor and the gate electrode 310 of the ground select transistor. The upper surface of the first filling insulation pattern 286$a$ may be lower than a bottom surface of the first gate electrode 310$a$ of the erase transistor, and may be higher than the bottom surface of the gate electrode 310 of the ground select transistor.

A second recess 380 corresponding to a remaining upper space in the channel hole may be formed above the first filling insulation pattern 286$a$. The first channel 284$a$ may be exposed by a sidewall of the second recess 380, and the first filling insulation pattern 286$a$ may be exposed by a bottom of the second recess 380.

Figure 18:
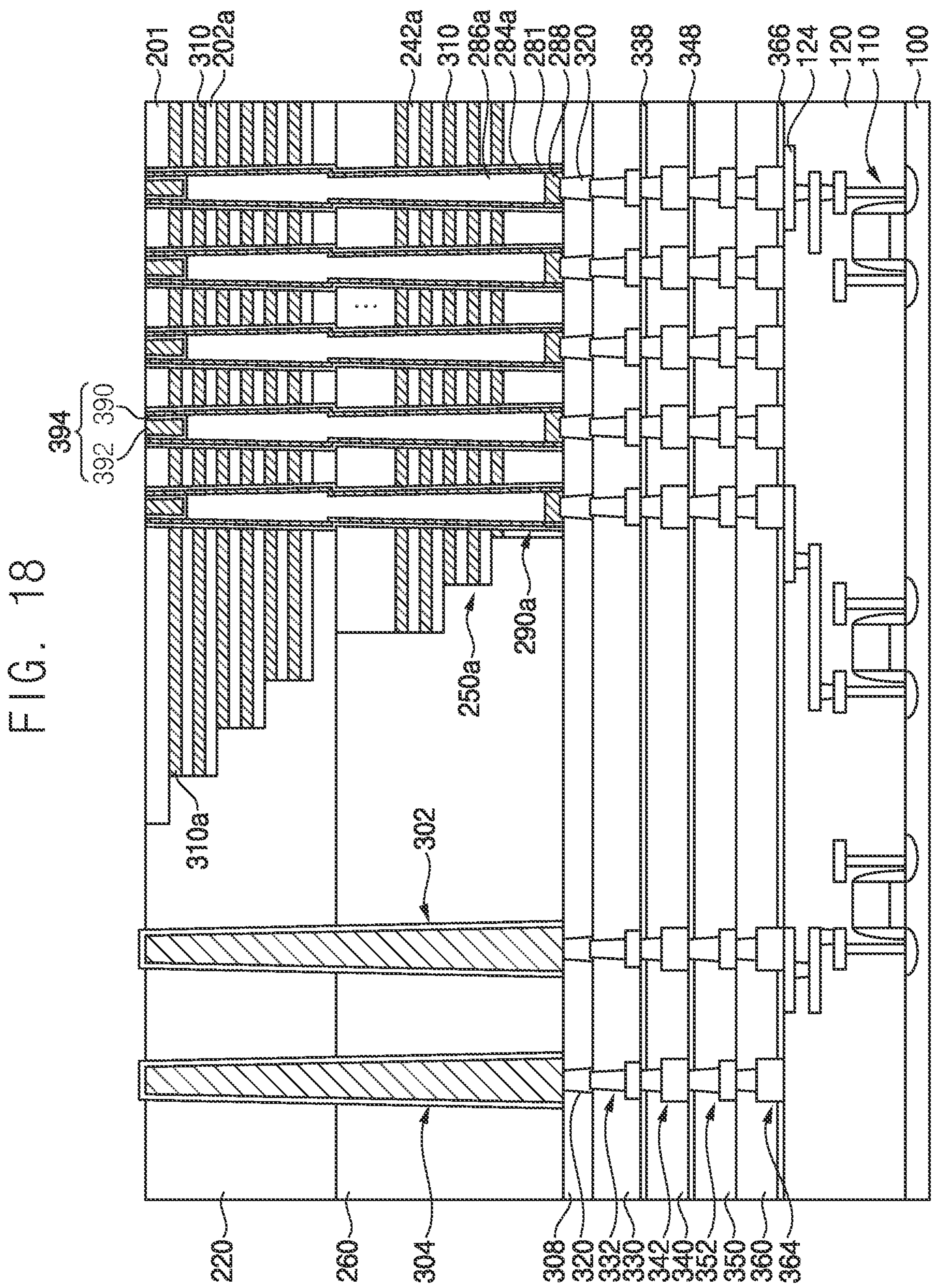
Figure 19:
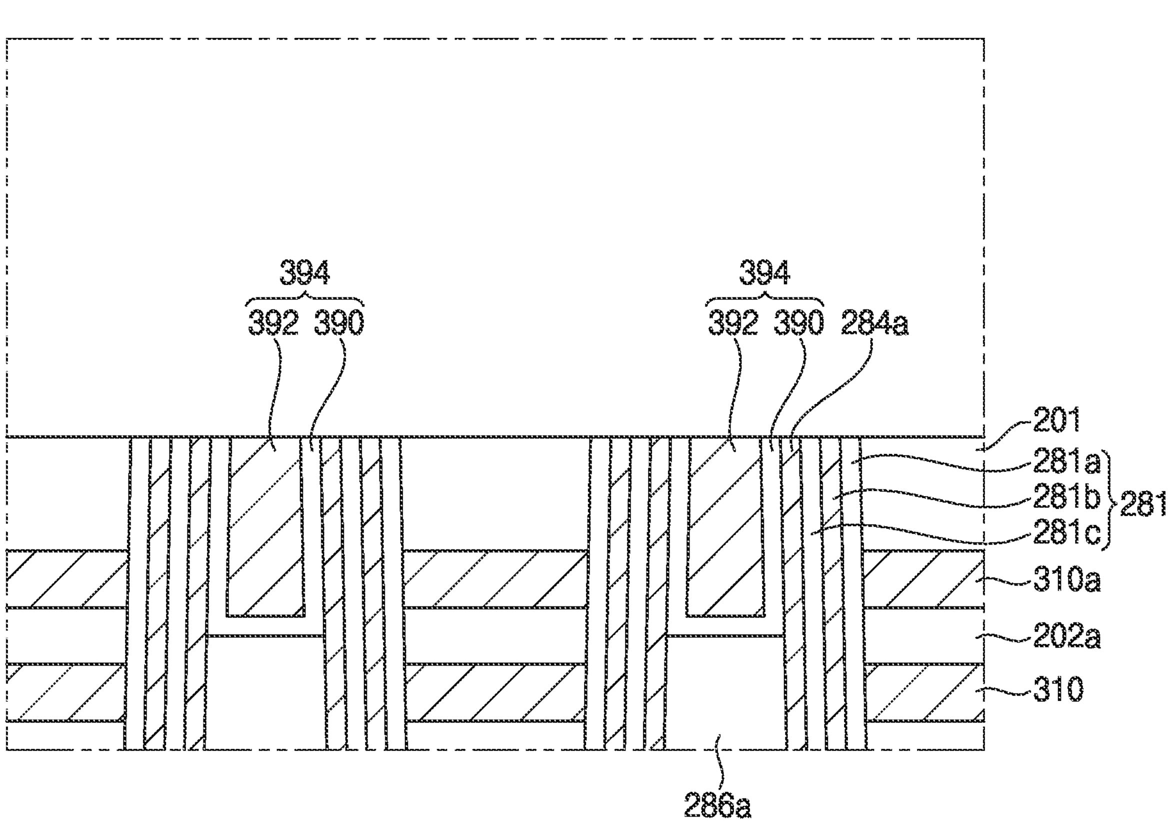

Referring to FIGS. 18 and 19, an undoped semiconductor liner 390 may be formed along a profile of the sidewall and bottom of the second recess 380. In some example embodiments of the present inventive concept, the undoped semiconductor liner 390 may include polysilicon undoped with impurities. In some example embodiments of the present inventive concept, the undoped semiconductor liner 390 may include single-crystal silicon, an organic semiconductor, or a carbon nanostructure.

A doped semiconductor pattern 392 may be formed on the undoped semiconductor liner 390 to fill the second recess 380. In some example embodiments of the present inventive concept, the doped semiconductor pattern 392 may include polysilicon doped with N-type impurities. In some example embodiments of the present inventive concept, the doped semiconductor pattern 390 may include single-crystal silicon, an organic semiconductor, or a carbon nanostructure doped with N-type impurities.

For example, a first polysilicon layer undoped with impurities may be conformally formed on the sidewall and bottom of the second recess 380 and the upper surface of the lowermost insulation pattern 201. A doped semiconductor layer doped with N-type impurities may be formed on the first polysilicon layer to fill the second recess 380. For example, when the doped semiconductor layer is deposited on the first polysilicon layer, n-type impurities may be doped in-situ. Thereafter, the first polysilicon layer and the doped semiconductor layer may be removed by a planarization process to expose an upper surface of the lowermost insulation pattern 201. Accordingly, the undoped semiconductor liner 390 and the doped semiconductor pattern 392 may be formed in the second recess 380. For example, the planarization process may include a chemical mechanical polishing process and/or an etch-back process.

The undoped semiconductor liner 390 may serve as a barrier for forming a depletion region, and may prevent diffusion of impurities from the doped semiconductor pattern 392. In some example embodiments of the present inventive concept, the undoped semiconductor liner 390 may have a thickness of about 3 nm to about 10 nm. When the thickness of the undoped semiconductor liner is less than about 3 nm, generation of the depletion region may be difficult. When the thickness of the undoped semiconductor liner 390 is greater than about 10 nm, an e-field may be decreased.

In some example embodiments of the present inventive concept, a doping concentration of the doped semiconductor pattern 392 that is positioned adjacent to a boundary between the undoped semiconductor liner 390 and the doped semiconductor pattern 392 may be less than about $2\times10^{19}/cm^3$. For example, a doping concentration of a region of the doped semiconductor pattern 392 that is adjacent to a boundary between the undoped semiconductor liner 390 and the doped semiconductor pattern 392 may be less than about $2\times10^{19}/cm^3$. When the doping concentration of the doped semiconductor pattern 392 that is adjacent to the boundary between the undoped semiconductor liner 390 and the doped semiconductor pattern 392 is greater than about $2\times10^{19}/cm^3$, it may be difficult for the undoped semiconductor liner 390 to function as an impurity diffusion barrier.

The undoped semiconductor liner 390 and the doped semiconductor pattern 392 formed in the second recess 380 may be disposed to face a sidewall of the first gate electrode 310$a$ of the erase transistor. For example, a sidewall of the undoped semiconductor liner 390 and a sidewall of the doped semiconductor pattern 392 may face a sidewall of the first gate electrode 310$a$ of the erase transistor. The undoped semiconductor liner 390 and the doped semiconductor pattern 392 may serve as a second channel 394 of the erase transistor. The erase transistor may include the first channel 284$a$ and the second channel 394 stacked to face the first gate electrode 310$a$.

As the doped semiconductor pattern 392 is doped with N-type impurities, the doped semiconductor pattern 392 may serve as a hole source for injecting holes into the first channel 284$a$ during an operation of the erase transistor. In addition, as the undoped semiconductor liner 390 is interposed between the first channel 284$a$ and the doped semiconductor pattern 392, the depletion region may be generated in the first channel 284$a$ and the undoped semiconductor liner 390 during the operation of the erase transistor. The undoped semiconductor liner 390 may serve as a diffusion barrier to prevent diffusion (or, e.g., movement) of impurities between the first channel 284$a$ and the doped semiconductor pattern 392.

In some example embodiments of the present inventive concept, a grain size of the first channel 284$a$ may be greater than a grain size of the undoped semiconductor liner 390. A heat treatment of first channel 284$a$ the may be performed several times by the previous process of forming the undoped semiconductor liner 390, and thus, the grain size of the first channel 284*a* may be increased more than the grain size of the undoped semiconductor liner 390.

By the above process, a channel structure 290*a* may be formed in the channel hole. The channel structure 290*a* may include the data storage structure 281, the first channel 284*a*, the first filling insulation pattern 286*a*, the capping pattern 288, the undoped semiconductor liner 390 and the doped semiconductor pattern 392.

Figure 20:
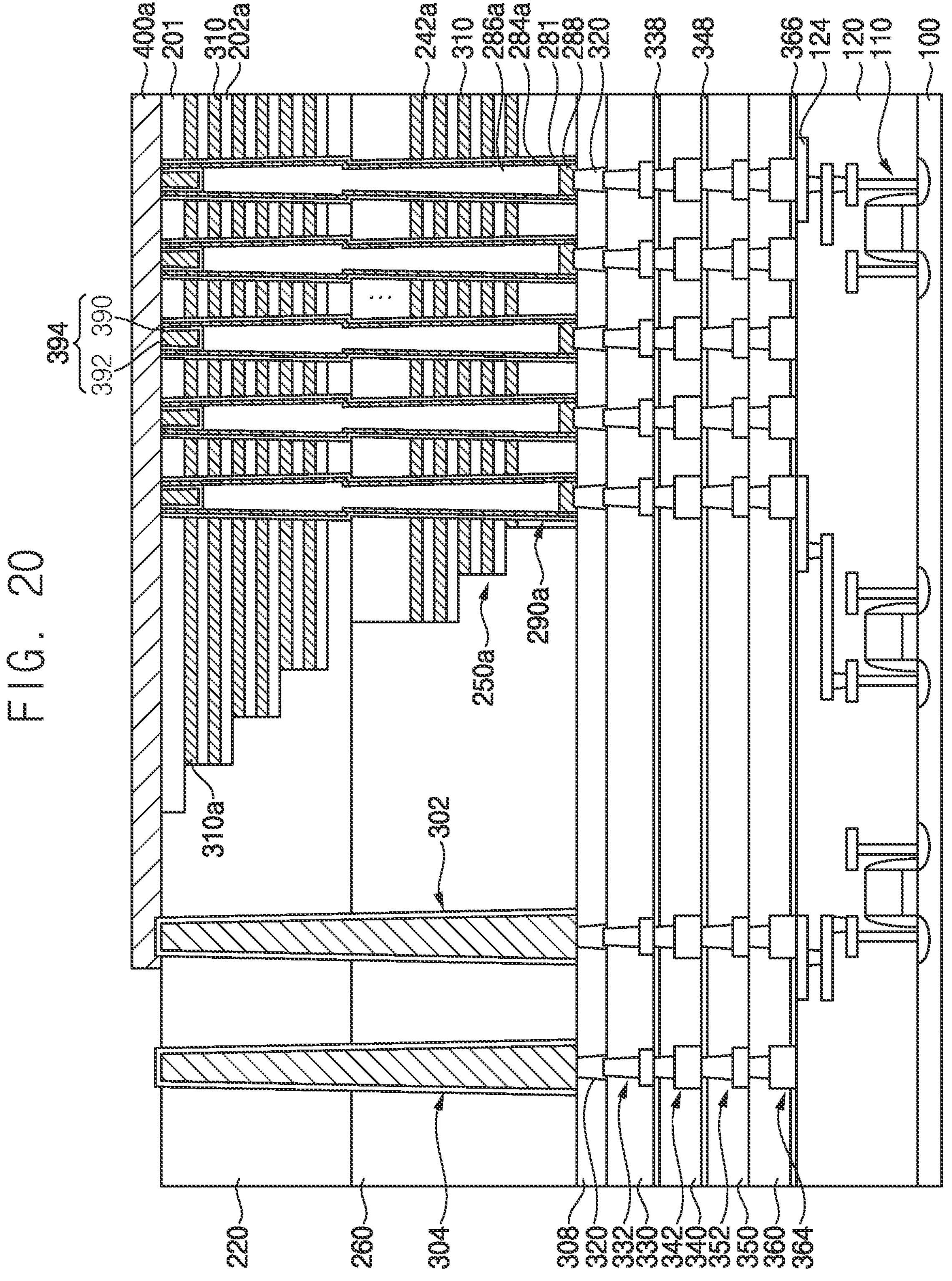

Referring to FIG. 20, an upper base layer may be formed to cover the lowermost insulation pattern 201, the first insulating interlayer 220, the channel structure 290*a*, and the first and second contact plugs 302 and 304. The upper base layer may include, for example, polysilicon doped with N-type impurities.

In some example embodiments of the present inventive concept, a polysilicon layer may be deposited while doping with n-type impurities in-situ to form the upper base layer. In some example embodiments of the present inventive concept, a polysilicon layer may be deposited, and then N-type impurities may be doped into the polysilicon layer to form upper base layer.

Thereafter, a heat treatment process may be performed on the upper base layer so as to activate impurities in the upper base layer. For example, the heat treatment process may include a laser annealing process. When the laser annealing process is performed, the heat treatment may be performed on a surface of the upper base layer. Therefore, thermal damages of the lower wirings may be minimized by the laser annealing process.

A portion of the upper base layer may be etched to form an upper base pattern 400*a* contacting the pattern structure 250*a* and the first contact plug 302. A portion of the upper base layer on the first insulating interlayer 220 may be removed. The upper base pattern 400*a* might not contact the second contact plug 304. An upper surface of the second contact plug 304 may be exposed to outside.

In some example embodiments of the present inventive concept, the heat treatment process for activation of the impurities and the patterning process of the upper base layer may be performed in reverse order.

Figure 21:
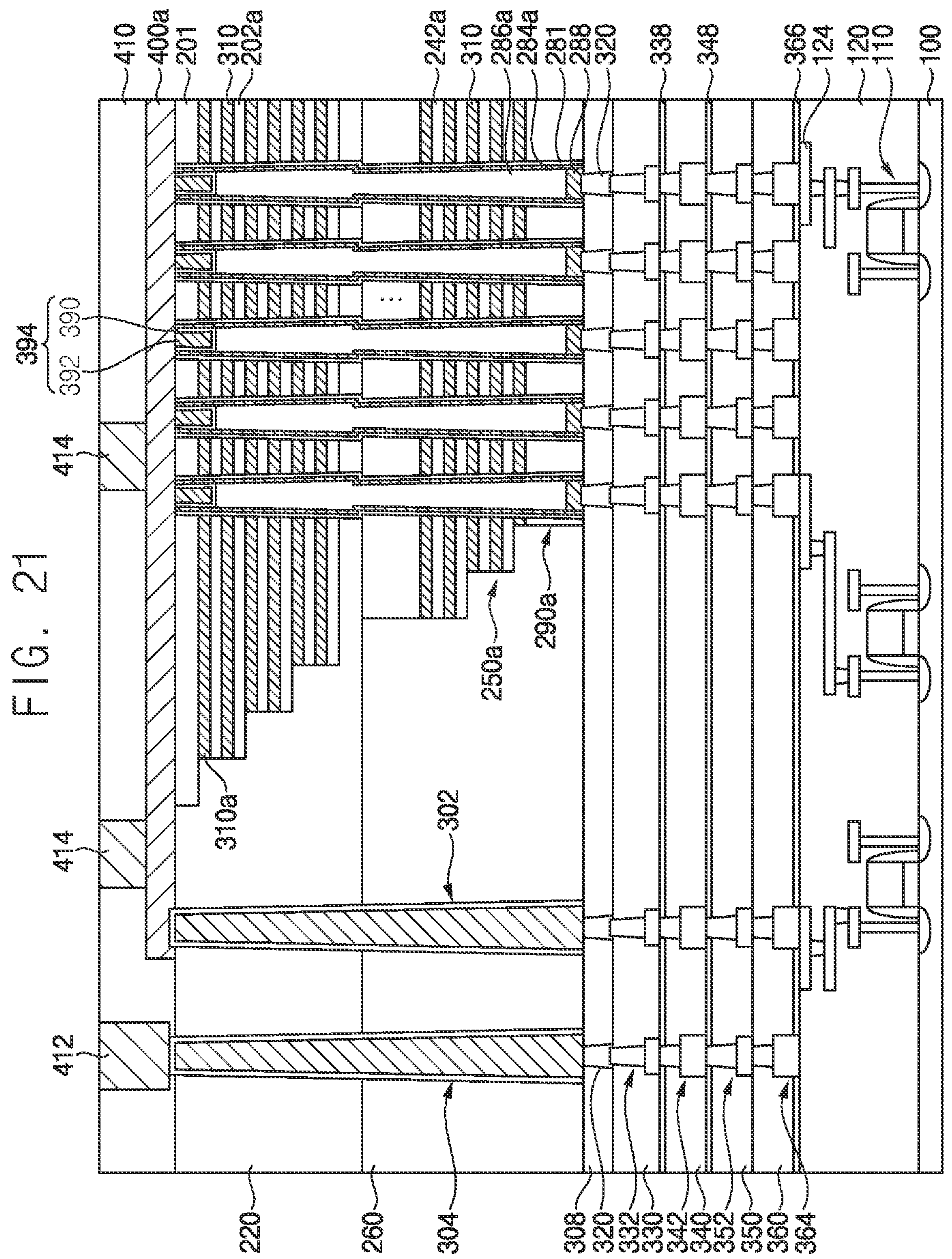

Referring to FIG. 21, an upper insulating interlayer 410 may be formed to cover the first insulating interlayer 220, the upper base pattern 400*a*, and the second contact plug 304. A first upper contact plug 412 may be formed in the upper insulating interlayer 410, and the first upper contact plug 412 may be connected to the second contact plug 304. In addition, a second upper contact plug 414 may be formed in the upper insulating interlayer, and the second upper contact plug 414 may be connected to the upper base pattern 400*a*.

Thereafter, upper wirings may be formed on the first and second upper contact plugs 412 and 414.

A bonding-type vertical semiconductor device manufactured by the above-described processes may have following structural characteristics.

Figure 22:
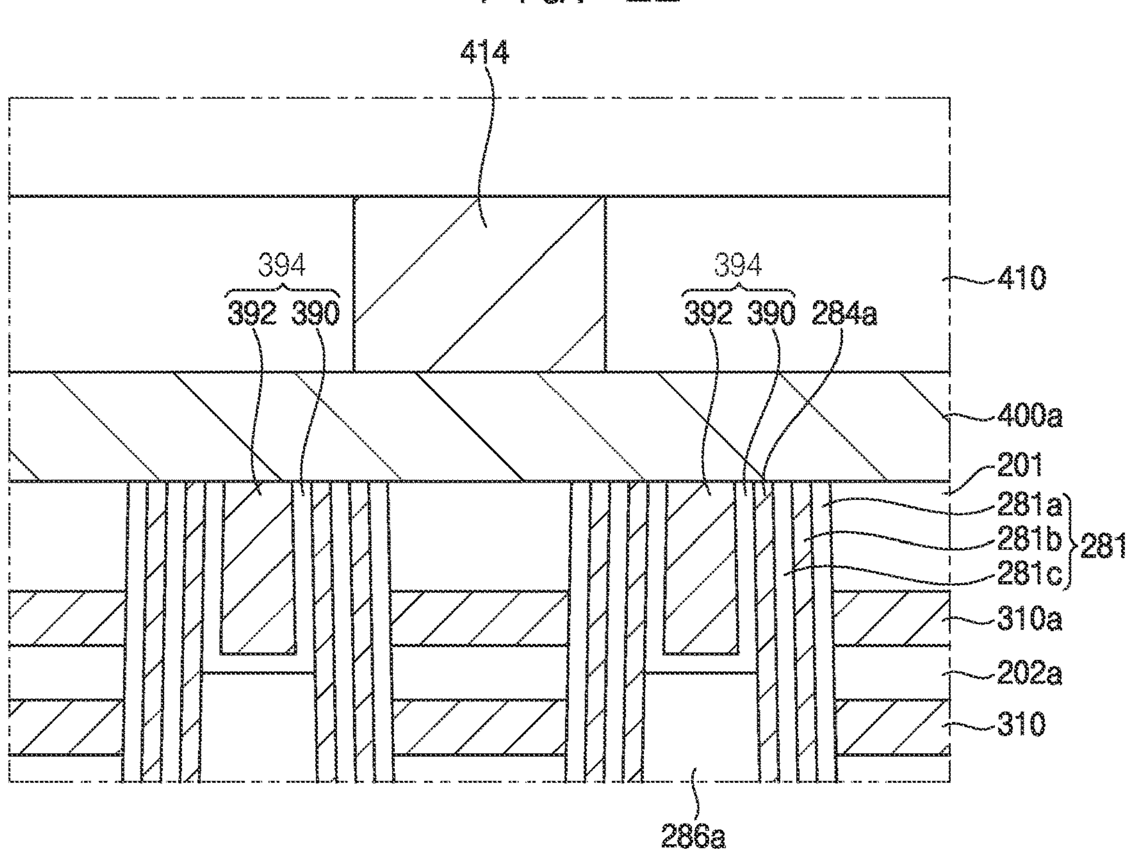
FIG. 22 is an enlarged cross-sectional view of a portion of the vertical semiconductor device according to example embodiments of the present inventive concept.
Figure 23:
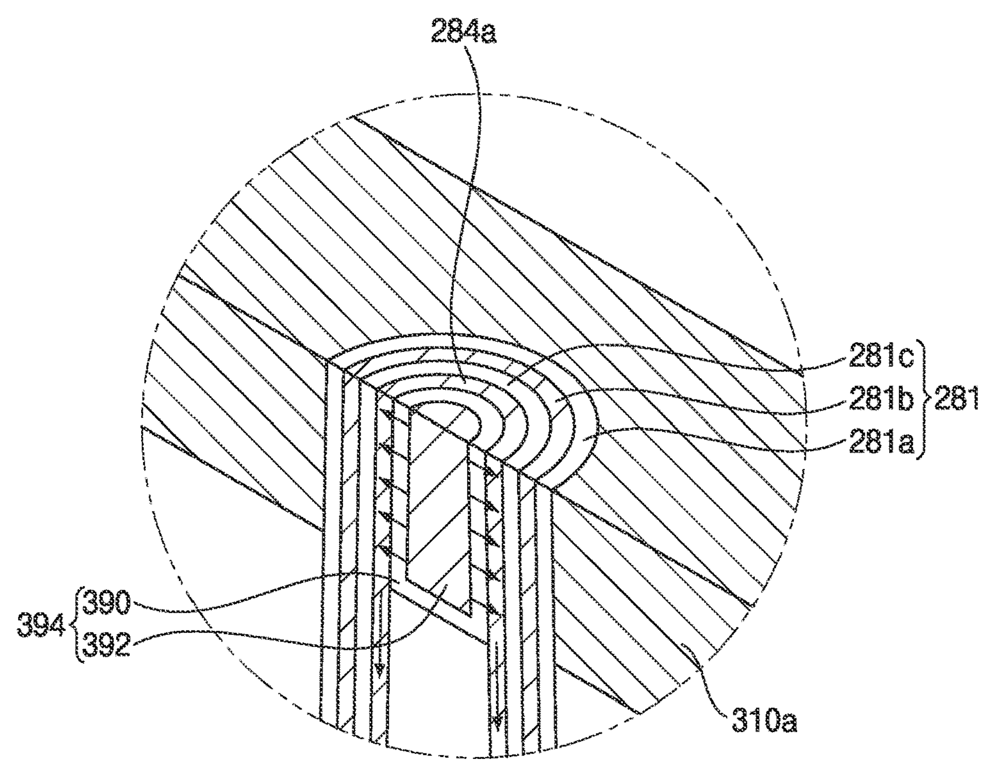
FIG. 23 is an enlarged cutaway perspective view of a portion of the vertical semiconductor device according to example embodiments of the present inventive concept.

FIG. 22 is an enlarged cross-sectional view of a portion of the vertical semiconductor device according to some example embodiments of the present inventive concept. FIG. 23 is an enlarged cutaway perspective view of a portion of the vertical semiconductor device according to some example embodiments of the present inventive concept.

Particularly, FIGS. 22 and 23 may be a portion of an erase transistor.

Since structural characteristics of the vertical semiconductor device are shown in FIG. 21, the structural characteristics may be described with reference to FIG. 21 together.

Referring to FIGS. 21 to 23, the bonding type vertical semiconductor device may include a lower circuit pattern 110, which is formed on a first substrate 100, and a lower insulating interlayer 120, which covers the lower circuit pattern 110.

A first bonding pattern 124 may be formed on the lower insulating interlayer 120. The first bonding pattern 124 may include metal, e.g., copper or aluminum.

A pattern structure 250*a*, in which an insulation pattern 202*a* and 242*a* and a gate electrode 310 are alternately and repeatedly stacked in the vertical direction, may be formed on the lower insulating interlayer 120. An edge of the pattern structure 250*a* may have an inverted stepped shape. The pattern structure 250*a* may have the stepped shape in which a length of an edge portion gradually increases from a lower portion to an upper portion. The pattern structure 250*a* may extend in the first direction.

An uppermost gate electrode may serve as a first gate electrode 310*a* included in an erase transistor for erasing data. A gate electrode 310 of a ground select transistor may be disposed below the first gate electrode 310*a*. For example, the gate electrode 310 of the ground select transistor may be disposed directly below the first gate electrode 310*a*. The gate electrodes 310 in each of the cell transistors and the string select transistors may be disposed under the ground select transistor. The first gate electrode 310*a* and the gate electrodes 310 may include a barrier metal pattern and a metal pattern. The barrier metal pattern may include, e.g., titanium, titanium nitride, tantalum, tantalum nitride, or the like, and the metal pattern may include tungsten.

Insulating interlayers 220, 260, 308, 330, 340, 350 and 360 may be formed on the lower insulating interlayer 120 to cover the pattern structure 250*a*. In some example embodiments of the present inventive concept, first to seventh insulating interlayers 220, 260, 308, 330, 340, 350 and 360 may be formed on the lower insulating interlayer 120.

A second bonding pattern 364 may be formed on a lower surface of the seventh insulating interlayer 360. The second bonding pattern 364 may include metal, e.g., copper or aluminum. At least a portion of the first bonding pattern 124 may be overlapped with the second bonding pattern 364 in the vertical direction.

The lower insulating interlayer 120 and a lowermost insulating interlayer (e.g., a seventh insulating interlayer 360) may be bonded to each other. In addition, the first bonding pattern 124 and the second bonding pattern 364, which is overlapped with first bonding pattern 124, may contact to each other.

A bonding layer 366 may be formed between the lower insulating interlayer 120 and the seventh insulating interlayer 360. The bonding layer 366 may be interposed between the lower insulating interlayer 120 and the seventh insulating interlayer 360 to bond the lower insulating interlayer 120 and the seventh insulating interlayer 360 to each other. The bonding layer 366 may include, for example, SiCN.

Channel holes 270 may pass through the pattern structure 250*a* in the vertical direction. A channel structure 290*a* may be formed in each of the channel holes 270.

The channel structure 290*a* may include a data storage structure 281, a first channel 284*a*, a first filling insulation pattern 286*a*, a capping pattern 288, an undoped semiconductor liner 390 and a doped semiconductor pattern 392. The data storage structure 281, the first channel 284*a*, the undoped semiconductor liner 390 and the doped semiconductor pattern 392 may be exposed on an upper surface of the channel structure 290*a*.

The data storage structure 281 may have a structure in which a first blocking dielectric layer pattern 281*a*, a charge storage layer pattern 281*b*, and a tunnel insulation pattern 281*c* are stacked. The data storage structure 281 may have a cylindrical shape including openings at a top and a bottom thereof. The data storage structure 281 may be formed on an outer sidewall of the first channel 284*a*.

The first channel 284*a* may be formed on a sidewall of each of the channel holes 270. Accordingly, the first channel 284*a* may have a cylindrical shape with openings at a top and a bottom thereof. In some example embodiments of the present inventive concept, the first channel 284*a* may include polysilicon undoped with impurities.

The first filling insulation pattern 286*a* may be formed on the first channel 284*a* to partially fill the channel hole 270. An upper surface of the first filling insulation pattern 286*a* may be lower than a lower surface of the first gate electrode 310*a*, and may be higher than an upper surface of the gate electrode 310 of the ground select transistor.

The undoped semiconductor liner 390 and the doped semiconductor pattern 392 may be positioned at an upper portion of the channel structure 290*a*. The undoped semiconductor liner 390 may be formed on a surface of the first channel 284*a* and an upper surface of the first filling insulation pattern 286*a*. The doped semiconductor pattern 392 may be disposed on the undoped semiconductor liner 390 to fill an upper portion of the channel hole 270. The doped semiconductor pattern 392 may have a pillar shape or cylindrical shape. The undoped semiconductor liner 390 may at least partially surround an outer sidewall and bottom of the doped semiconductor pattern 392.

In some example embodiments of the present inventive concept, the undoped semiconductor liner 390 may include polysilicon undoped with impurities. In some example embodiments of the present inventive concept, the undoped semiconductor liner 390 may include single-crystal silicon, an organic semiconductor, or a carbon nanostructure. In some example embodiments of the present inventive concept, the doped semiconductor pattern 392 may include polysilicon doped with N-type impurities. In some example embodiments of the present inventive concept, the doped semiconductor pattern 390 may include single-crystal silicon, an organic semiconductor, or a carbon nanostructure doped with N-type impurities.

The undoped semiconductor liner 390 and the doped semiconductor pattern 392 may serve as a second channel 394.

In some example embodiments of the present inventive concept, the undoped semiconductor liner 390 may have a thickness of about 3 nm to about 10 nm. In some example embodiments of the present inventive concept, a doping concentration of the doped semiconductor pattern 392 that is adjacent to a boundary between the undoped semiconductor liner 390 and the doped semiconductor pattern 392 may be less than about $2\times10^{19}/cm^3$. For example, a doping concentration of a region of the doped semiconductor pattern 392 that is adjacent to a boundary between the undoped semiconductor liner 390 and the doped semiconductor pattern 392 may be less than about $2\times10^{19}/cm^3$.

A lower surface of the second channel 394 may be lower than a lower surface of the first gate electrode 310*a*, and may be higher than an upper surface of the gate electrode 310 of the ground select transistor. The second channel 394 may overlap a sidewall of the first gate electrode 310*a*. The lower surface of the second channel 394 may be positioned at a vertical level between the first gate electrode 310*a* and the gate electrode 310, of the ground transistor, vertically adjacent to the first gate electrode 310*a*.

The capping pattern 288 may be disposed at a lower portion of the channel structure 290*a*. The capping pattern 288 may be formed on a bottom surface of the first filling insulation pattern 286*a*, and may fill a lower portion of the channel hole. The capping pattern 288 may be formed on the first channel 284*a*. For example, the capping pattern 288 may be formed on side surfaces of the first channel 284*a*.

Wirings included in the insulating interlayers may be electrically connected to the channel structure 290*a*. In some example embodiments of the present inventive concept, first to third wirings 332, 342, and 352 may be formed in the insulating interlayers. In some example embodiments of the present inventive concept, the wirings 332, 342 and 352 may be electrically connected to the capping pattern 288 that is disposed at the lower surface of the channel structure 290*a*, and thus, the wirings 332, 342 and 352 may be electrically connected to the first channel 284*a*.

First and second contact plugs 302 and 304 may pass through the insulating interlayers. The first and second contact plugs 302 and 304 may be spaced apart from the pattern structure 250*a*. Accordingly, the first and second contact plugs 302 and 304 might not pass through the pattern structure 250*a*. The first and second contact plugs 302 and 304 may be electrically connected to the lower circuit patterns 110 by the wirings.

An upper base pattern 400*a* may be formed on the lowermost insulation pattern 201, the channel structure 290*a*, the first insulating interlayer 220 and the first contact plug 302.

For example, the upper base pattern 400*a* may contact the upper surface of the channel structure 290*a* and the upper surface of the first contact plug 302. The upper base pattern 400*a* may be disposed on at least the first channel 284*a* and the doped semiconductor pattern 392 in the channel structure 290*a*. For example, the upper base pattern 400*a* may contact at least the first channel 284*a* and the doped semiconductor pattern 392 in the channel structure 290*a*. For example, the upper base pattern 400*a* may contact the first channel 284*a* of the channel structure 290*a*, the undoped semiconductor liner 390, and the doped semiconductor pattern 392.

The upper base pattern 400*a* may include, for example, polysilicon doped with N-type impurities. The upper base pattern 400*a* might not cover the second contact plug 304.

An erase transistor disposed at a top portion of the pattern structure 250*a* may include the first gate electrode 310*a*, the data storage structure 281 disposed to face a sidewall of the first gate electrode 310*a*, the first channel 284*a*, the undoped semiconductor liner 390 and the doped semiconductor pattern 392. The data storage structure 281, the first channel 284*a*, the undoped semiconductor liner 390, and the doped semiconductor pattern 392 in the channel structure 290*a* may be sequentially disposed on the sidewall of the first gate electrode 310*a*. A channel of the erase transistor may include the first channel 284*a*, the undoped semiconductor liner 390 and the doped semiconductor pattern 392. The undoped semiconductor liner 390 may serve as a diffusion barrier to prevent diffusion of impurities between the first channel 284*a* and the doped semiconductor pattern 392. In addition, the undoped semiconductor liner 390 may serve as a barrier for forming a depletion layer in the first channel 284*a* and the undoped semiconductor liner 390.

When the erase transistor is operated, the depletion region may be formed in the first channel 284*a* and the undoped semiconductor liner 390 adjacent to the first gate electrode

310*a*. In addition, gate induced drain leakage currents may be generated due to a tunneling between a band (i.e., energy band) of the doped semiconductor pattern 392 and a band of the first channel 284*a*, and thus, holes (i.e., charge carriers) may be supplied to the first channel 284*a*. Since the tunneling between bands occurs in a lateral direction from the surface of the doped semiconductor pattern 392, which is overlapped with the first gate electrode 310*a*, a region where the tunneling between bands occurs may be increased. Accordingly, the gate induced drain leakage currents may be increased, and thus, a performance of erasing data stored in the memory cell may be increased. For example, even if the number of memory cells included in one cell string (e.g., the cell structure including cell transistors connected in the vertical direction) connected to the erase transistor is increased, data stored in the memory cells may be effectively and collectively erased.

The ground select transistor, the cell transistors, and the string select transistor disposed under the erase transistor may include the gate electrode 310, which is disposed under the first gate electrode 310*a*, the data storage structure 281 disposed to face the sidewall of the gate electrode 310 and the first channel 284*a*. Sidewalls of the gate electrodes 310 other than the first gate electrode 310*a* may face the data storage structure 281 and the first channel 284*a* that are in the channel structure 290*a*. As such, the erase transistor may have the channel different from channels of the cell transistors and string select transistors.

An upper insulating interlayer 410 may cover the insulating interlayer, the upper base pattern 400*a* and the second contact plug 304. A first upper contact plug 412 may pass through the upper insulating interlayer 410 and may be connected to the second contact plug 304. A second upper contact plug 414 may pass through the upper insulating interlayer 410 and may be connected to the upper base pattern 400*a*. Upper wirings may be formed on the first and second upper contact plugs 412 and 414.

Figure 24:
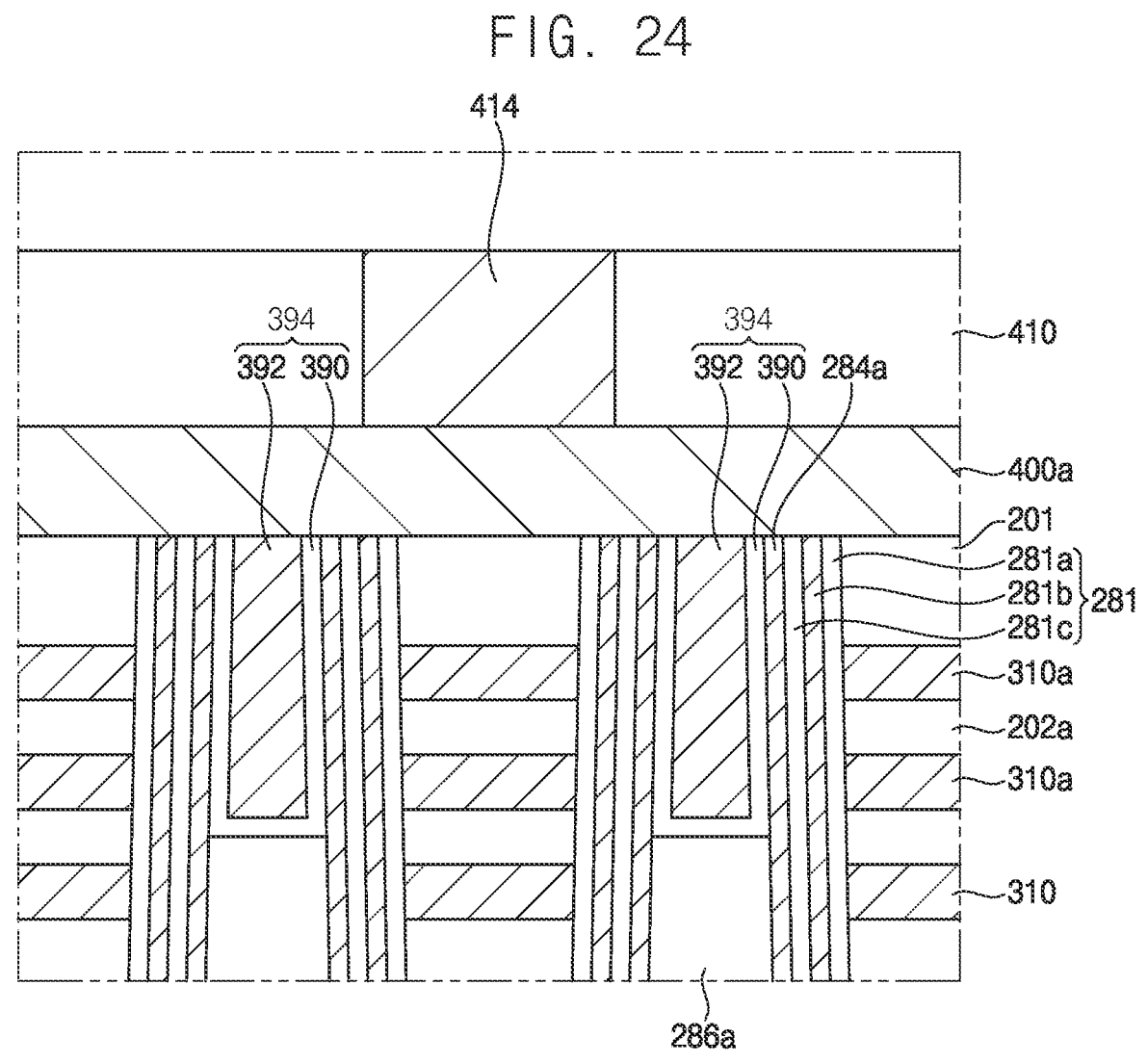

FIG. 24 is an enlarged cross-sectional view of a portion of a vertical semiconductor device according to some example embodiments of the present inventive concept.

FIG. 24 is an enlarged view of a portion of an erase transistor. The vertical semiconductor device described below is the same as or similar to the vertical semiconductor device described with reference to FIGS. 21 to 23, except for one cell string including a plurality of erase transistors.

Referring to FIG. 24, the plurality of gate electrodes positioned at an upper portion of the pattern structure may serve as first gate electrodes 310*a* of erase transistors for erasing data. A gate electrode 310 of a ground select transistor may be disposed directly below a lowermost first gate electrode 310*a* among the first gate electrodes 310*a*. FIG. 24 illustrates that one cell string includes two erase transistors, but the number of the erase transistors included in the one cell string might not be limited thereto.

The channel structure 290*a* may be formed in the channel hole passing through the pattern structure 250*a* in the vertical direction. The channel structure 290*a* may include the data storage structure 281, the first channel 284*a*, the first filling insulation pattern 286*a*, the capping pattern 288, the undoped semiconductor liner 390, and the doped semiconductor pattern 392.

The first filling insulation pattern 286*a* may be formed on the first channel 284*a* to partially fill the channel hole 270. An upper surface of the first filling insulation pattern 286*a* may be lower than a lower surface of the lowermost first gate electrode 310*a*, and may be higher than the gate electrode 310 of the ground select transistor.

The undoped semiconductor liner 390 and the doped semiconductor pattern 392 may serve as the second channel 394. A bottom of the second channel 394 may be lower than the bottom of the lowermost first gate electrode 310*a*, and may be higher than an upper surface of the gate electrode 310 in the ground select transistor. The second channel 394 may overlap sidewalls of the plurality of first gate electrodes 310*a*.

As the one cell string may include the plurality of erase transistors, gate induced drain leakage currents may be increased. Therefore, a performance of erasing data stored in the memory cell may be increased. Each of the erase transistors may include the first gate electrode 310*a*, and the data storage structure 281, the first channel 284*a*, the undoped semiconductor liner 390 and the doped semiconductor pattern 392 that are disposed to face a sidewall of the first gate electrode 310*a*. As the undoped semiconductor liner 390 and the doped semiconductor pattern 392 are formed, the gate induced drain leakage currents may increase. Therefore, a performance of erasing data stored in the memory cell may be increased.

Figure 25:
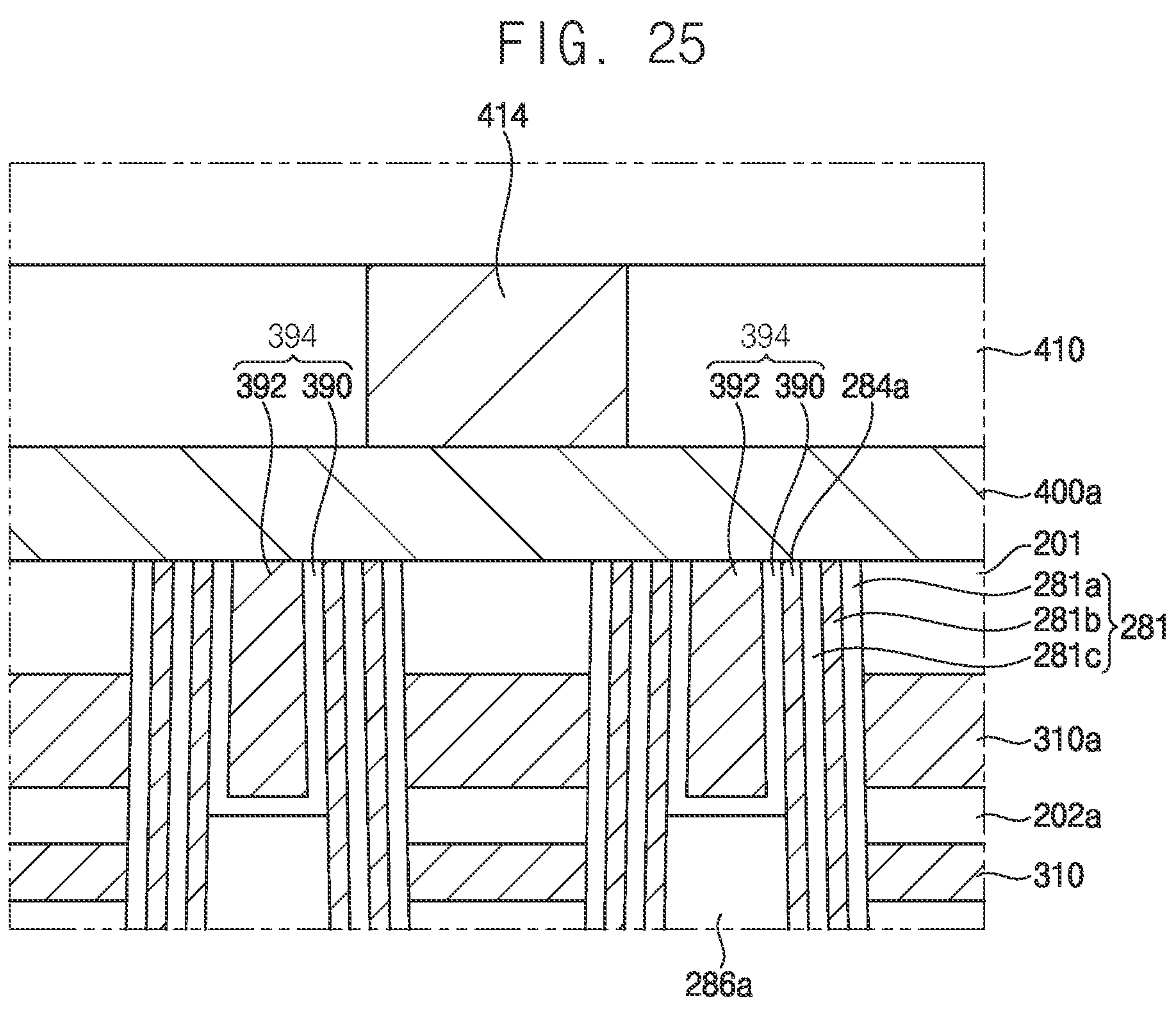
FIG. 25 is an enlarged cross-sectional view of a portion of a vertical semiconductor device according to example embodiments of the present inventive concept.

FIG. 25 is an enlarged cross-sectional view of a portion of a vertical semiconductor device according to some example embodiments of the present inventive concept.

FIG. 25 is an enlarged view of a portion of an erase transistor. The vertical semiconductor device described below is the same as or similar to the vertical semiconductor device described with reference to FIGS. 21 to 23, except for a first gate electrode in an erase transistor.

Referring to FIG. 25, at least one gate electrode positioned at an uppermost portion of the pattern structure 250*a* may serve as a first gate electrode 310*a* of the erase transistor for erasing data. The first gate electrode 310*a* may have a first thickness in the vertical direction.

The ground select transistor, the memory cell transistors, and the string select transistor may be disposed under the erase transistor. Gate electrodes 310 of the ground select transistor, the memory cell transistors, and the string select transistors may be disposed under the first gate electrode 310*a*. Each of the gate electrodes 310 may have a second thickness less than the first thickness.

The channel structure 290*a* may be formed in the channel hole passing through the pattern structure 250*a* in the vertical direction. The channel structure 290*a* may include the data storage structure 281, the first channel 284*a*, the first filling insulation pattern 286*a*, the capping pattern 288, the undoped semiconductor liner 390, and the doped semiconductor pattern 392.

The first filling insulation pattern 286*a* may be formed on the first channel 284*a* to partially fill the channel hole 270. An upper surface of the first filling insulation pattern 286*a* may be lower than a lower surface of the first gate electrode 310*a*, and may be higher than an upper surface of the gate electrode 310 of the ground select transistor.

The undoped semiconductor liner 390 and the doped semiconductor pattern 392 may serve as the second channel 394. A bottom of the second channel 394 may be lower than a bottom of the first gate electrode 310*a*, and may be higher than the gate electrode 310 of the ground select transistor. The second channel 394 may overlap a sidewall of the first gate electrode 310*a*.

As the thickness of the first gate electrode 310*a* in the erase transistor increases, a surface area of the doped semiconductor pattern 392 overlapping the first gate electrode may increase. Accordingly, a region in which the tunneling between bands occurs may be increased, so that gate induced drain leakage currents may be increased. Therefore, an ability to erase data stored in the memory cell may be increased.

As described above, according to embodiments of the present inventive concept, in the vertical semiconductor device, the channel of the erase transistor may include the first channel, the undoped semiconductor liner, and the doped semiconductor pattern. Therefore, the erase transistor may increase the performance of erasing data stored in the memory cell.

While the present inventive concept has been described with reference to example embodiments thereof, it will be understood by those of ordinary skill in the art that various changes in form and details may be made thereto without departing from the spirit and scope of the present inventive concept.

What is claimed is:

1. A vertical semiconductor device, comprising:

a pattern structure including a plurality of insulation patterns and a plurality of gate electrodes that are alternately and repeatedly stacked on a substrate, wherein the pattern structure includes a first gate electrode serving as a gate electrode of an erase transistor, wherein the first gate electrode is one of the plurality of gate electrodes, a channel structure in a channel hole passing through the pattern structure, wherein the channel structure includes a data storage structure, a first channel, an undoped semiconductor liner, a doped semiconductor pattern, a filling insulation pattern and a capping pattern; and an upper base pattern including doped poly silicon disposed on the pattern structure, and wherein the upper base pattern contacts the first channel, the doped semiconductor pattern, the undoped semiconductor liner and an uppermost insulation pattern, wherein the doped semiconductor pattern has a pillar shape, and the undoped semiconductor liner surrounds an outer sidewall and bottom of the doped semiconductor pattern, wherein a vertical portion of the undoped semiconductor liner contacts the first channel and a horizontal portion of the undoped semiconductor liner contacts the filling insulation pattern, and wherein the data storage structure, the first channel, the undoped semiconductor liner, and the doped semiconductor pattern are sequentially disposed on a sidewall of the first gate electrode.

2. The vertical semiconductor device of claim 1, wherein the first gate electrode is positioned at an uppermost position among the plurality of gate electrodes included in the pattern structure.

3. The vertical semiconductor device of claim 1, wherein the doped semiconductor pattern includes polysilicon doped with N-type impurities, and the undoped semiconductor liner includes polysilicon undoped with impurities.

4. The vertical semiconductor device of claim 1, wherein a lower surface of a second channel including the undoped semiconductor liner and the doped semiconductor pattern is positioned at a vertical level between the first gate electrode and a second gate electrode, of the plurality of gate electrodes, vertically adjacent to the first gate electrode.

5. The vertical semiconductor device of claim 1, wherein the first channel includes polysilicon undoped with impurities.

6. The vertical semiconductor device of claim 1, wherein sidewalls of the plurality of gate electrodes face the data storage structure and the first channel in the channel structure.

7. A vertical semiconductor device, comprising:

lower circuit patterns disposed on a first substrate;

a lower insulating interlayer covering the lower circuit patterns;

a pattern structure disposed on the lower insulating interlayer, wherein the pattern structure includes a plurality of insulation patterns and a plurality of gate electrodes alternately and repeatedly stacked in a vertical direction that is substantially perpendicular to an upper surface of the first substrate, and wherein the pattern structure includes a first gate electrode serving as a gate electrode of an erase transistor, wherein the first gate electrode is one of the plurality of gate electrodes;

an insulating interlayer disposed on the lower insulating interlayer, and covering a lower portion of the pattern structure;

a channel structure in each of channel holes that are passing through the pattern structure; and an upper base pattern including doped poly silicon disposed on the pattern structure, wherein the upper base pattern contacts a first channel, a doped semiconductor pattern, an undoped semiconductor liner and an uppermost insulation pattern, wherein the channel structure includes:

a data storage structure and the first channel sequentially stacked on a sidewall of each of the channel holes;

the undoped semiconductor liner and the doped semiconductor pattern disposed on the first channel and facing a sidewall of the first gate electrode; and a filling insulation pattern contacting the first channel, the undoped semiconductor liner and the doped semiconductor pattern, and wherein the filling insulation pattern is disposed in each of the channel holes, wherein the doped semiconductor pattern has a pillar shape, and the undoped semiconductor liner surrounds an outer sidewall and bottom of the doped semiconductor pattern, and wherein a vertical portion of the undoped semiconductor liner contacts the first channel and a horizontal portion of the undoped semiconductor liner contacts a filling insulation pattern.

8. The vertical semiconductor device of claim 7, wherein the first gate electrode is positioned at an uppermost position among the plurality of gate electrodes included in the pattern structure.

9. The vertical semiconductor device of claim 7, wherein the doped semiconductor pattern includes polysilicon doped with N-type impurities, and the undoped semiconductor liner includes polysilicon undoped with impurities.

10. The vertical semiconductor device of claim 7, wherein a lower surface of a second channel including the undoped semiconductor liner and the doped semiconductor pattern contacts an upper surface of the filling insulation pattern, and wherein the lower surface of a second channel is positioned at a vertical level between the first gate electrode and a second gate electrode, of the plurality of gate electrodes, vertically adjacent to the first gate electrode.

11. The vertical semiconductor device of claim 7, wherein each of the data storage structure and the first channel have a cylindrical shape including openings at a top and a bottom thereof.

12. The vertical semiconductor device of claim 7, wherein the data storage structure, the first channel, the undoped semiconductor liner, and the doped semiconductor pattern are exposed on the upper surface of the channel structure.

13. The vertical semiconductor device of claim 7, wherein the undoped semiconductor liner has a thickness of about 3 nm to about 10 nm.

14. The vertical semiconductor device of claim 7, wherein a doping concentration of a region of the doped semiconductor pattern that is adjacent to a boundary between the undoped semiconductor liner and the doped semiconductor pattern is less than 2×1019/cm3.

15. A vertical semiconductor device, comprising:

lower circuit patterns formed on a first substrate;

a bonding layer disposed on the lower circuit patterns;

wiring disposed on the bonding layer;

a pattern structure disposed on the wiring, wherein the pattern structure includes a plurality of insulation patterns and a plurality of gate electrodes alternately and repeatedly stacked in a vertical direction that is substantially perpendicular to an upper surface of the first substrate, and the pattern structure extends in a first direction parallel to the upper surface of the first substrate, wherein a sidewall of the pattern structure has a stepped shape;

an upper base pattern including poly silicon disposed on the pattern structure; and a channel structure disposed in a channel hole that is passing through the pattern structure, and the channel structure contacts the upper base pattern, wherein the plurality of gate electrodes, which are included in the pattern structure, includes a first gate electrode disposed at an uppermost position among the plurality of gate electrodes, and a plurality of second gate electrodes, of the plurality of gate electrodes, is disposed below the first gate electrode, wherein the channel structure includes a data storage structure, a first channel, an undoped semiconductor liner, and a doped semiconductor pattern sequentially disposed to face a sidewall of the first gate electrode, wherein the upper base pattern contacts the first channel, the doped semiconductor pattern, the undoped semiconductor liner and an uppermost insulation pattern, wherein the doped semiconductor pattern has a pillar shape, and the undoped semiconductor liner surrounds an outer sidewall and bottom of the doped semiconductor pattern, and wherein a vertical portion of the undoped semiconductor liner contacts the first channel and a horizontal portion of the undoped semiconductor liner contacts a filling insulation pattern.

* * * * *